(12) United States Patent
Brennan et al.

(10) Patent No.: US 6,911,389 B2
(45) Date of Patent: Jun. 28, 2005

(54) SELF ALIGNED VIAS IN DUAL DAMASCENE INTERCONNECT, BURIED MASK APPROACH

(75) Inventors: Kenneth D. Brennan, Austin, TX (US); Paul Gillespie, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 214 days.

(21) Appl. No.: 10/246,061

(22) Filed: Sep. 18, 2002

(65) Prior Publication Data

US 2004/0053501 A1 Mar. 18, 2004

(51) Int. Cl.[7] .............................................. H01L 21/44
(52) U.S. Cl. ....................... 438/622; 438/634; 438/635; 438/692; 438/717
(58) Field of Search ................................ 438/314–317, 438/622, 634–638, 692–693, 717–725

(56) References Cited

U.S. PATENT DOCUMENTS

| | | | |
|---|---|---|---|
| 5,891,799 A | 4/1999 | Tsui | |
| 5,985,746 A | 11/1999 | Kapoor | |
| 6,150,256 A | 11/2000 | Furukawa et al. | |
| 6,156,643 A * | 12/2000 | Chan et al. | 438/638 |
| 6,174,804 B1 | 1/2001 | Hsu | |
| 6,204,168 B1 * | 3/2001 | Naik et al. | 438/638 |
| 6,221,759 B1 | 4/2001 | Bothra et al. | |
| 6,281,585 B1 | 8/2001 | Bothra | |
| 6,312,874 B1 * | 11/2001 | Chan et al. | 430/314 |
| 6,323,118 B1 | 11/2001 | Shih et al. | |
| 6,603,206 B2 * | 8/2003 | Wang et al. | 257/774 |
| 6,727,169 B1 * | 4/2004 | Soininen et al. | 438/622 |

\* cited by examiner

*Primary Examiner*—Duy-Vu N. Deo
(74) *Attorney, Agent, or Firm*—Jacqueline J. Garner; W. James Brady, III; Frederick J. Telecky, Jr.

(57) ABSTRACT

Methods are disclosed for forming vias, trenches, and interconnects through diffusion barrier, etch-stop, and dielectric materials for interconnection of electrical devices in dual damascene structures of a semiconductor device. A buried via mask at the etch-stop level provides openings with two or more adjacent via misalignment error regions merged into rectangular windows aligned orthogonal to a long axis of the underlying conductive features of a first metal level. The rectangular windows used together with openings in a hard mask form via portions, and the openings in the hard mask provide trench portions. Via and trench portions coincide during trench or via etch, as well as during hard mask or etch-stop layer etch together forming an interconnect cavity, which may then be filled with a conductive material to provide a conductive interconnect between the conductive feature of the first metal level and a second metal level.

23 Claims, 13 Drawing Sheets

SELF ALIGNED VIAS IN DUAL DAMASCENE INTERCONNECT, BURIED MASK APPROACH

FIELD OF INVENTION

The present invention relates generally to semiconductor devices and more particularly to methods for forming self aligned vias and trenches in interconnect layers in the fabrication of semiconductor devices.

BACKGROUND OF THE INVENTION

In the manufacture of semiconductor products such as integrated circuits, individual electrical devices are formed on or in a semiconductor substrate, and are thereafter interconnected to form circuits. Interconnection of these devices within an integrated circuit is typically accomplished by forming a multi-level interconnect network in layers formed over the electrical devices, by which the device active elements are connected to other devices to create the desired circuits. Individual wiring layers within the multi-level network are formed by depositing an insulating or dielectric layer over the discrete devices or over a previous interconnect layer, and patterning and etching contact openings such as vias. Conductive material, such as tungsten is then deposited into the vias to form inter-layer contacts. A conductive layer may then be formed over the dielectric layer and patterned to form wiring interconnections between the device vias, thereby creating a first level of basic circuitry. Dielectric material is then deposited over the patterned conductive layer, and the process may be repeated any number of times using additional wiring levels laid out over additional dielectric layers with conductive vias therebetween to form the multi-level interconnect network.

As device densities and operational speeds continue to increase and transistor scaling proceeds into the deep sub-micron regime, reduction of the delay times in integrated circuits is desired. These delays are related to the resistance of interconnect metal lines through the multi-layer interconnect networks as well as the parasitic capacitance between adjacent metal lines. Recent interconnect processes have employed copper instead of aluminum, in order to reduce the resistivity of the interconnect metal lines which are formed in metal layers or structures. However, difficulties have been encountered in patterning (e.g., etching) deposited copper to form wiring patterns. Furthermore, copper diffuses rapidly in certain types of insulation/dielectric layers, such as silicon dioxide, leading to insulation degradation and/or copper diffusion through the insulation layers and into device regions.

Copper patterning difficulties have been avoided or mitigated through the use of single or dual damascene processes in which trenches are formed (etched) in a dielectric layer. A thin diffusion barrier (e.g., tantalum nitride) is deposited which "lines" the dual damascene trench and via over the insulative layers. Copper is then deposited into the trenches over the barrier layer, followed by planarization using a chemical mechanical polishing (CMP) process to leave a copper wiring pattern including the desired interconnect metal lines inlaid within the dielectric layer trenches and vias. In a single damascene process copper trench patterns are thus created which connect to pre-existing underlying vias, whereas in a dual damascene process, both vias and the trenches are filled at the same time using single copper deposition and CMP steps.

Copper diffusion issues have been addressed using copper diffusion barriers formed between the copper and the dielectric layers as well as between the copper and the silicon substrate. Such barriers are typically formed using conductive compounds of transition metals such as tantalum, tantalum nitride, tantalum silicon nitride, PVD tantalum, titanium nitride, and tungsten nitride as well as the various transition metals themselves. Insulators such as silicon nitride and silicon oxynitride have also been used as barrier materials between copper metallurgy and insulative layers. More recently, silicon carbide (SiC) has been used as a copper diffusion barrier material, as well as etch-stop layers and hard masks used during trench and/or via cavity formation.

RC delay times have also been addressed by recent developments in porous low dielectric constant (low-k) dielectric materials formed between the wiring metal lines, in order to reduce the capacitance therebetween and consequently to increase circuit speed. Examples of low-k dielectric materials include the spin-on-glasses (SOGs), as well as organic and quasi-organic materials such as polysilsesquioxanes, fluorinated silica glasses (FSGs) and fluorinated polyarylene ethers. Organic, non silicaceous materials such as the fluorinated polyarylene ethers are seeing an increased usage in semiconductor processing technology because of their favorable dielectric characteristics and ease of application. Other low-k insulator materials include organo-silicate-glasses (OSGs), for example, having dielectric constants (k) as low as about 2.6–2.8, and ultra low-k dielectrics having dielectric constants below 2.5. OSG materials are low density silicate glasses to which alkyl groups have been added to achieve a low-k dielectric characteristic.

Single and dual damascene processes using OSG, FSG, a low-k dielectric or ultra low-k dielectric materials, SiC and SiC:H materials, and copper metals can thus be employed to increase speed, reduce cross-talk, and reduce power consumption in modern high-speed, high-density devices.

Either the trench level or the via level can be etched first to form a dual damascene interconnect. The first approach has greater worst case misalignment error to the underlying level as compared to the via first approach. Both approaches require resist patterning over topography, reducing photolithography process margin.

Generally inherent to the dual damascene approach is two dielectric layers, the IDL (inter-level dielectric) and the IMD (intra-metal dielectric), which are typically separated by an embedded etch stop layer (e.g., SiN, or the newer SiC:H). In the via-first approach, the embedded etch stop layer serves as an etch stop for the trench etch, and is therefore also referred to as a "trench e-stop layer" (TES). The trench e-stop layer TES is sometimes also be referred to as a "buried via mask", as this layer takes on a dual role. The TES layer continues to provide a trench e-stop function, but also provides a mask function to aid forming the lower via to the underlying metal level lines (or other such conductive features) of the M1 metal layer. However, in a conventional approach, openings in the buried via mask were aligned to the long axis of the underlying metal lines. This on-axis alignment, however, tends to somewhat limit the margin of error allowable between a metal line and the resultant conductive interconnect between the metal levels, because the width of these via mask openings may still limit the interconnect contact area in some instances.

Further, as metal lines and interconnects are scaled down into sub-micron widths, alignment error margins also critically reduce between the various metal level lines and the conductive interconnects connecting the metal levels. Thus, the masks which guide the etching of these interconnects also provide an increasingly important role, while alignment error margins are reduced as features continue to crowd together.

FIGS. 1A–1D, for example, illustrate a partial plan view and a partial cross sectional view of a conventional approach of forming a conductive interconnect between two metal lines (conductive features) at two respective metal levels M1 and M2. FIGS. 1A–1C illustrate ideal alignment between the metal lines, and the interconnect formed therebetween, while FIG. 1D illustrates a worst case misalignment error situation between the conductive features and the interconnect. While FIGS. 1C and 1D only show the interconnect cavity which is formed between the M1 and the M2 metal levels, it is understood that a subsequent method step typically deposits a conductive interconnect material within the cavity. In addition, a diffusion barrier layer is commonly deposited before a copper conductive interconnect material is deposited in the interconnect cavity to act as a sidewall diffusion barrier.

FIGS. 1A–1D illustrate a conventional implementation, wherein an interconnect comprising a via and a trench is formed in a semiconductor device for connecting a conductive feature in a first level to a feature associated with a second level. The illustrated portions of the interconnect process involve the use of inter-level dielectrics, a hard mask and trench etch-stop layers for use in forming vias to be filled with copper.

In FIG. 1A, a semiconductor device 100 is illustrated at an intermediate stage of fabrication processing, wherein one or more electrical devices (e.g., transistors, memory cells, etc., not shown) have been formed on or in a substrate 104, such as silicon. In order to interconnect such devices, and/or to provide external connections thereto, interconnect processing is employed to fabricate one or more levels of copper connection metal lines for forming a desired circuit. Copper-filled vias are formed to vertically provide electrical connections from one such level to another, wherein insulative dielectric material is formed between such trenches and vias to isolate unconnected conductive features from one another.

A conductive feature 106 is formed within an opening in a metal dielectric material 105 of a first metal layer (M1) over the substrate 104 in FIG. 1A, and a first diffusion barrier layer (B1) 108 is formed over the conductive feature 106 typically when the M1 conductive feature 106 comprises copper, wherein the via is provided to connect the conductive feature 106 to a first interconnect level. An first inter-level dielectric layer (ILD1) 110 is formed over the B1 first diffusion barrier layer 108. The ILD1 first inter-level dielectric layer 110 provides insulation between overlying and underlying conductive features and relatively low dielectric constant characteristics are desirable in avoiding or mitigating RC delays and cross-talk between signals in the finished integrated circuit of the device 100.

A trench etch-stop layer (TES) 111 is deposited over the ILD1 layer 110, and a via opening 111' may be etched in the trench etch-stop layer TES 111 as shown in both plan and cross sectional views of FIG. 1A. In the dual damascene process, the TES layer 111 may be covered by overlying layers, and thus may also be referred to as an "embedded trench etch-stop layer" 111, or a "buried via mask" 111. The trench etch-stop layer (TES) 111 provides a stopping point for etching of an overlying trench and the via opening 111' provides a mask for the further etching of the via underlying the trench etch-stop layer.

Thereafter in FIG. 1B, a second inter-level dielectric layer (ILD2) 112 is formed over the TES layer 111, a hard mask layer (HM) 114 is formed over ILD2 layer 112, and an M2 second metal layer opening 114' (for the later formation of an M2 conductive feature) may be etched in the HM layer 114 as shown in both plan and cross sectional views of FIG. 1B. The HM layer 114 is typically used in trench formation in a dual damascene type interconnect process while forming overlying trenches for interconnection of copper metal lines with vias formed through the ILD1 layer 110.

In FIG. 1C, a first etch process 122 is then performed through the openings 114' in the HM layer 114 to remove the exposed portions of the ILD2 layer 112, leaving a trench cavity 116. The etch process 122 continues by removing the exposed portion of the ILD1 layer 110 and the B1 layer 108 through the buried via mask of the TES layer 111, leaving a via cavity 118, and an exposed portion of the conductive feature 106 in the M1 metal layer. Therefore, a trench (cavity) may be formed above the TES layer 111, and a via (cavity) formed below the TES layer 111, collectively forming an interconnect cavity. The interconnect cavity may then be filled to form a conductive interconnect to connect the M1 and M2 conductive features.

FIGS. 1A–1C further demonstrates, that when an ideal alignment is achieved between the M1 and M2 metal layer conductive features and the via mask opening 111', a conductive interconnect may be formed therebetween providing a full contact area 120 in the conventional method. However, as was discussed, ideal alignment is difficult as the increased densities and sub-micron conductor trends continue.

FIG. 1D illustrates an alignment problem with a conventional method approach. The M1 and the M2 metal layer conductive features, and the via mask opening 111' are shown placed in worst-case misalignment positions. A positioning error 123 resulting from an offset 124 in the position of the via mask opening causes a reduced contact area 120' for the conductive interconnect which may produce increased contact resistance, power consumption, and increased photo re-work at via and trench levels.

In addition, incorporating these newer materials and process methods into workable semiconductor fabrication processes presents additional challenges. Among these are the formation of damascene structures, including vias and trenches. In particular, it is desirable to provide self-aligned formation of vias and trenches through the dielectric layers accomplished in a single etch operation with increased alignment error margins between corresponding metal level features to properly interconnect electrical devices such as transistors, memory cells, and the like to limit power consumption and to take advantage of the potential performance benefits of such newer interconnect network materials and process methods.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention relates to formation techniques of vias, trenches, and the like for interconnecting electrical devices in the fabrication of integrated circuits. The vias, trenches, and interconnects may be formed through diffusion barrier, etch-stop, and low or ultra low-k dielectric materials in dual damascene structures of a semiconductor device. The invention provides a buried via mask at the etch-stop level having openings with two or more adjacent vias each having surrounding worst-case alignment error regions merged into a rectangular window (window) aligned generally orthogonal to a long axis of at least one of two underlying conductive features associated with a first metal level. The rectangular window is used to form a via portion, and an opening in a hard mask provides trench portions. Via and trench portions coincide during trench or via etch, together forming an interconnect cavity. The interconnect cavity may then be filled with a conductive material to provide a conductive interconnect between the conductive feature of the first metal level and a second metal level.

The invention provides for self-aligned interconnects between the conductive features and increased alignment error margins in the relative placement of the conductive features of the interconnected metal levels. Improved contact area can be achieved at the interface of the conductive feature and the interconnect, while the worst case misalignment error is roughly equivalent to a conventional "via-first" approach. In addition, the invention may be employed to simplify photo rework at the trench and via levels, as no low-k dielectric is exposed to an ash process. Further, the invention, in combination with the use of porous low-k dielectrics, permits the etch process to be selective to the M2 level hard mask and the buried mask layer etch-stop materials. In addition, via poisoning of resist at the subsequent trench photo level is substantially eliminated with the approach of the invention.

In a second aspect of the invention, a buried via mask is provided at the etch-stop level having openings with two or more adjacent vias each having surrounding worst-case alignment error regions which are merged as in the first aspect of the invention. However, in this implementation, a rectangular TES material region is aligned orthogonal to a long axis of an underlying conductive feature of a first metal level, leaving an etch-stop layer with more open area. The rectangular TES material region is used to partially define the formation of a via portion, while an opening in a hard mask partially defines the formation of trench portions. Again, via and trench portions coincide during trench or via etch, together forming an interconnect cavity. The interconnect cavity may then be filled with a conductive material to provide a conductive interconnect between the conductive feature of the first metal level and a second metal level.

The second aspect of the invention also provides beneficial features of the first aspect of the invention such as self-aligned interconnects, increased alignment error margins, improved contact area at the interface of the conductive feature and the interconnect, simplified photo rework, and elimination of via poisoning by resist.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1A:
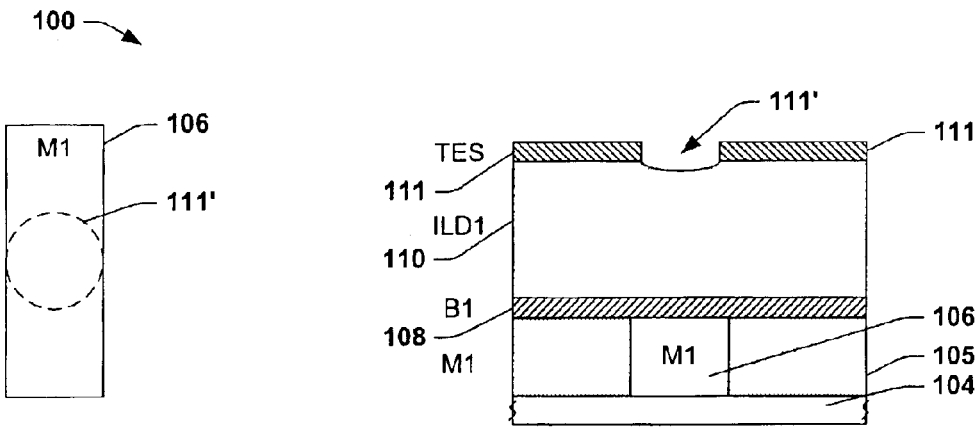
FIG. 1A is a partial plan view and a corresponding partial cross-sectional side view illustrating a conventional approach for patterning a trench etch-stop layer in a semiconductor device having a conductive feature in a first metal layer M1 formed thereon.
Figure 1B:
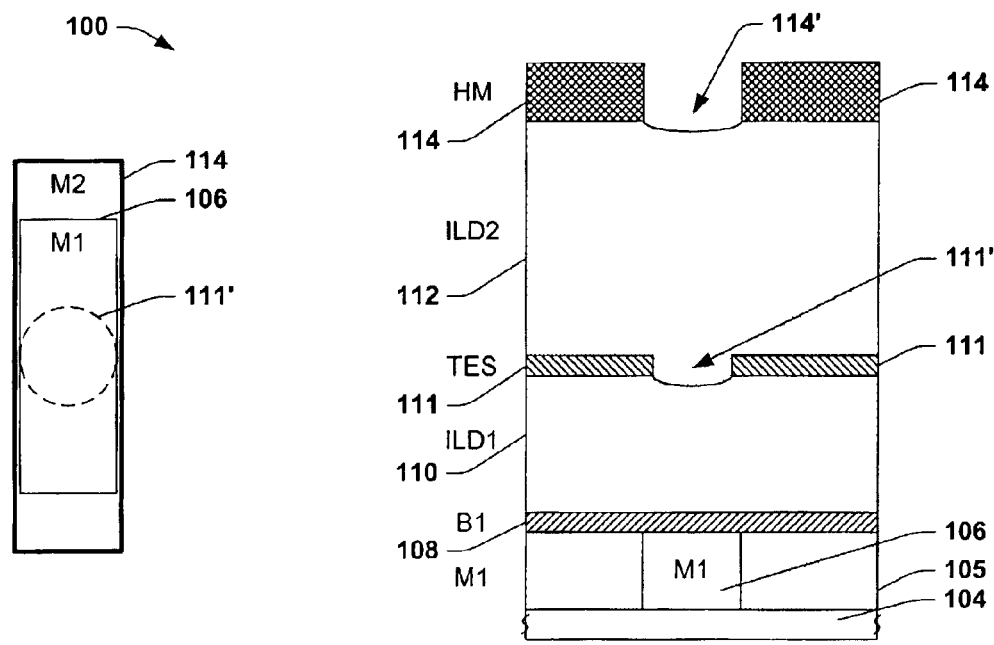
FIG. 1B is a partial plan view and a corresponding partial cross-sectional side view illustrating a conventional method approach for patterning a hard mask and a inter-level dielectric layer over the trench etch-stop layer in the semiconductor device of FIG. 1A.
Figure 1C:
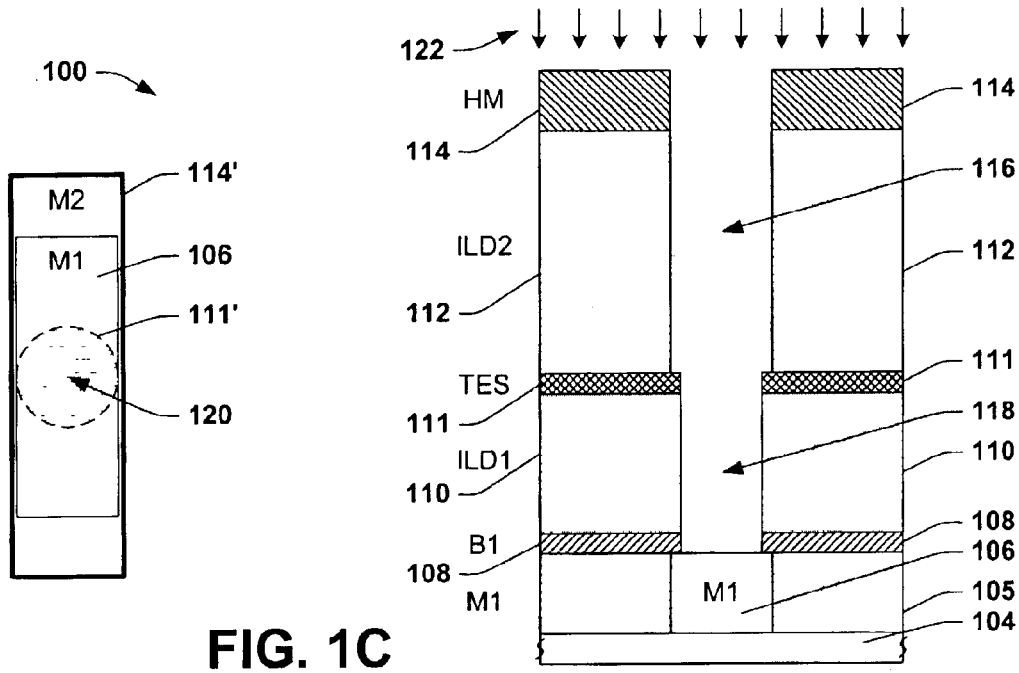
FIG. 1C is a partial plan view and a corresponding partial cross-sectional side view illustrating a conventional approach for etching a trench cavity down to the trench etch-stop layer and a via cavity down to an M1 first metal conductive feature in the semiconductor device of FIG. 1B, when a hard mask M2 opening is in alignment with the trench etch-stop (buried via mask) which is also in alignment with the M1 conductive feature.
Figure 1D:
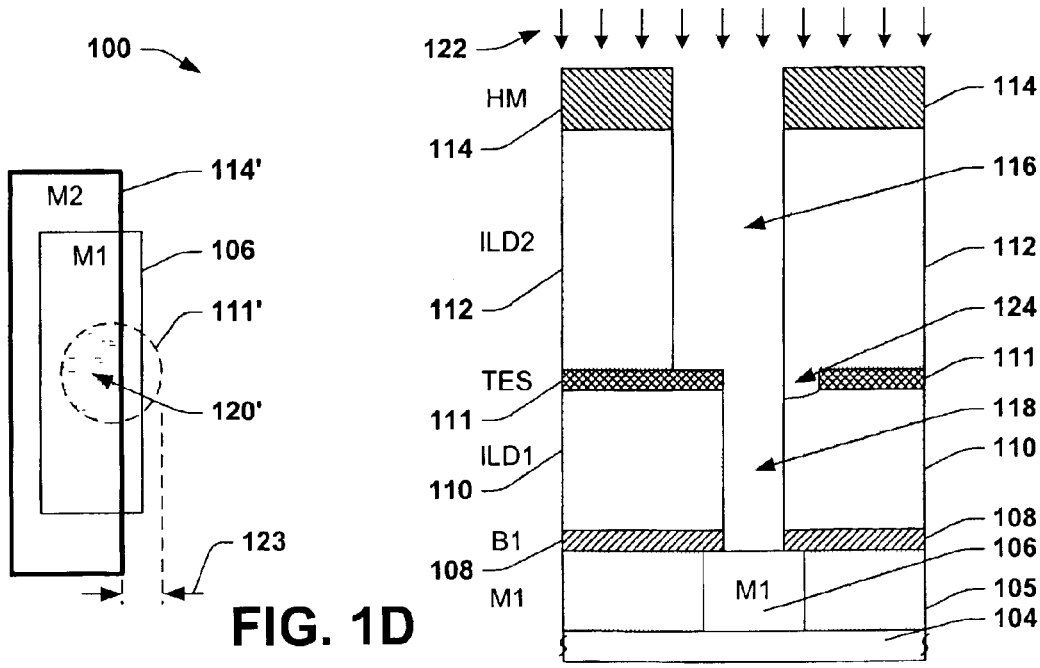
FIG. 1D is a partial plan view illustrating a conventional approach for etching a trench cavity down to the trench etch-stop layer and a via cavity down to the M1 first metal conductive feature in a semiconductor device similar to that of FIG. 1C, when the hard mask M2 opening is in misalignment relative to the trench etch-stop via mask, which is also in misalignment relative to the M1 conductive feature.

The present invention will now be described with reference to the attached drawings, wherein like reference numerals are used to refer to like elements throughout. The invention relates to methods and techniques used in forming vias, trenches and other openings during interconnect processing of integrated circuits and other devices. One or more implementations of the invention are hereinafter illustrated and described in the context of trench and via formation in dual damascene structures, where etch-stop and hard mask layers are used in the formation of an interconnect cavity for later filling with a conductive material such as copper. However, it will be appreciated by those skilled in the art that the invention is not limited to the exemplary implementations illustrated and described hereinafter. In particular, the various aspects of the invention may be employed in association with processing of devices using OSG, FSG, or other porous low-k or ultra low-k dielectric materials.

One aspect of the invention provides methods for forming vias or trenches, which may be practiced as part of a process involving the formation of one or more interconnect (metal) layers or levels, where the vias and trenches are used to connect electrical signals from one metal level to another. In a first such level, vias may be formed through an OSG or other type inter-level dielectric layer (ILD) so as to provide electrical connection to active regions of electrical devices formed on or in a semiconductor substrate. Metal connection layer features are then formed, such as through copper deposition in damascene trench structures having connection to the vias. Further interconnect levels may then be constructed using copper filled vias to connect electrical signals to such layers as needed to implement a desired circuit. The invention may also be employed in dual damascene processes where vias are filled with copper material at the same time the trenches are filled.

In the dual damascene approach, two ILD layers are typically separated by an embedded etch stop layer (e.g., SiN or SiC:H). In the via-first approach, the embedded etch stop layer serves as an etch-stop (e-stop) for the trench etch, and is therefore also referred to as a "trench etch-stop" (TES) layer. In the present invention, the TES layer is also referred to as a "buried via mask", as this layer takes on a dual role. First, the TES layer provides a trench e-stop function. Secondly, the TES layer provides a mask function for the formation of vias which contact the underlying conductive features of the M1 metal layer.

Figure 2A:
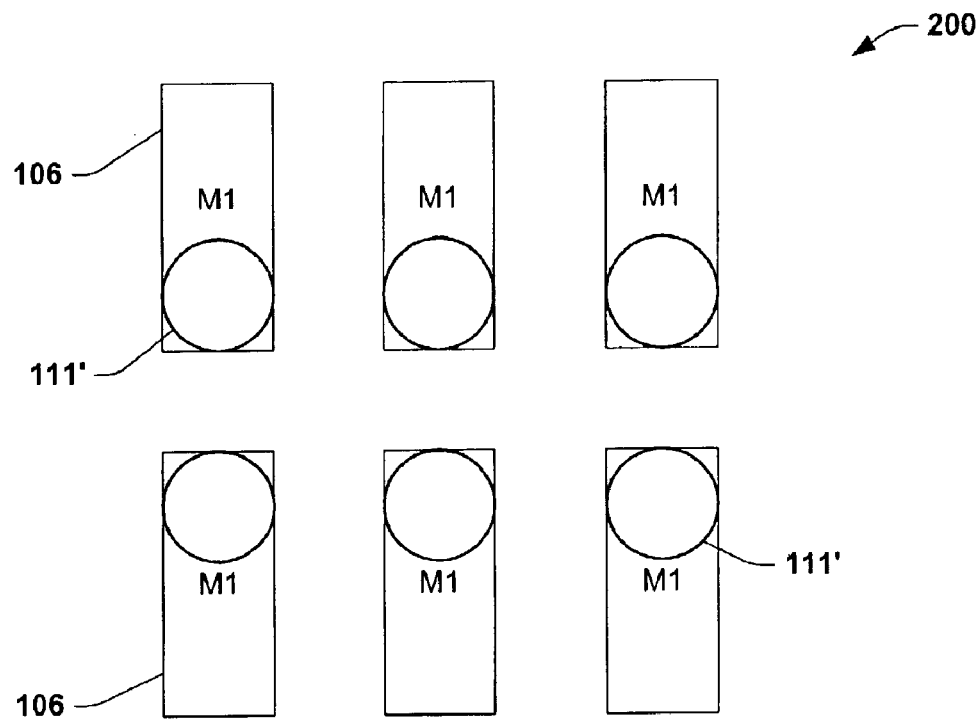
FIG. 2A is a partial plan view illustrating several vias formed by a conventional approach, with each via formed in alignment over a corresponding M1 first metal conductive feature in a semiconductor device.
Figure 2B:
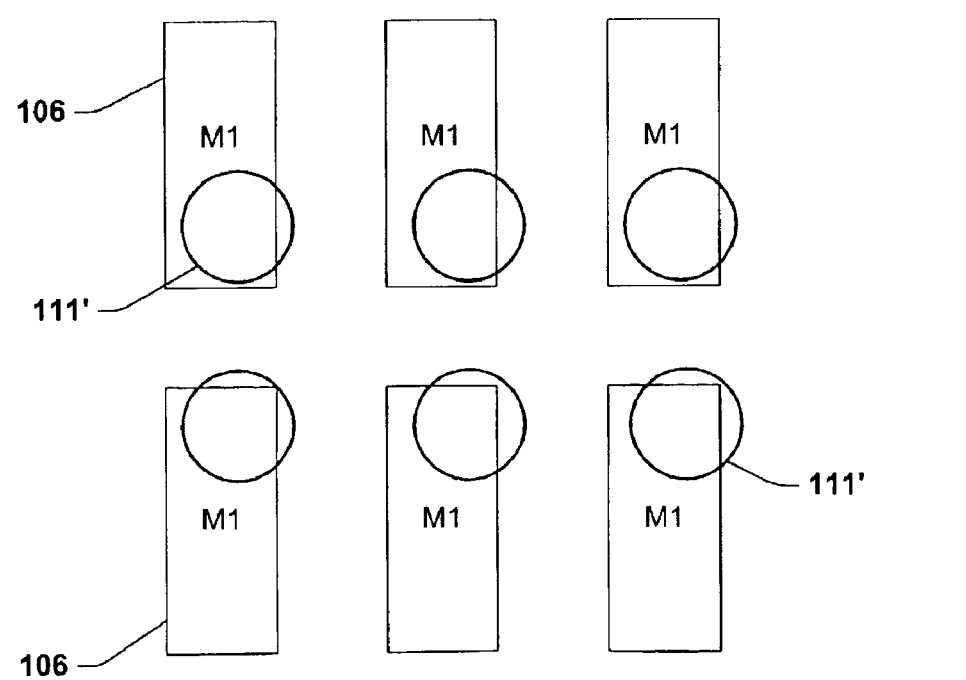
FIG. 2B is a partial plan view illustrating several vias formed by a conventional method approach, with each via formed in misalignment over the corresponding M1 first metal conductive feature in the semiconductor device of FIG. 2A.

FIGS. 2A and 2B illustrate partial plan views of several vias formed in a semiconductor device 200 by a conventional approach, similar to that of the vias and trenches of the semiconductor device 100 of FIGS. 1A–1D, and as such, not all aspects of the device will be described again for purposes of brevity. In particular, FIG. 2A illustrates vias formed according to a conventional approach when the vias are formed in alignment over the underlying conductive features, and FIG. 2B illustrates when the vias are formed in misalignment over a corresponding M1 first metal conductive feature in the semiconductor device.

For example, in FIG. 2A, an M1 first metal conductive feature 106 in the semiconductor device 200 is formed in an M1 first metal layer overlying a substrate as previously discussed by a conventional method approach. Each via 111' is formed in alignment over a corresponding M1 first metal conductive feature 106 in the semiconductor device 200. By contrast, FIG. 2B illustrates several vias 111' formed by a similar conventional approach, in misalignment position over a corresponding M1 first metal conductive feature 106 in the semiconductor device 200.

The inventors have appreciated that the misalignment of the vias result in increased contact resistance at the interface of the via 111' and the conductive feature 106, which further results in an increase in power consumption over the potentially tens of millions of interconnects in a semiconductor device. In addition, as conductive features crowd and trend deeper into sub-micron dimensions, misalignment error margins shrink between metal levels and the interconnects used to connect them, and become more difficult to align. To aid in overcoming some of these alignment difficulties, the inventors have appreciated that a new method of using the trench etch-stop layer as a buried mask in combination with allowance for misalignment errors provides for the formation of self-aligned vias in a semiconductor device.

Figure 3A:
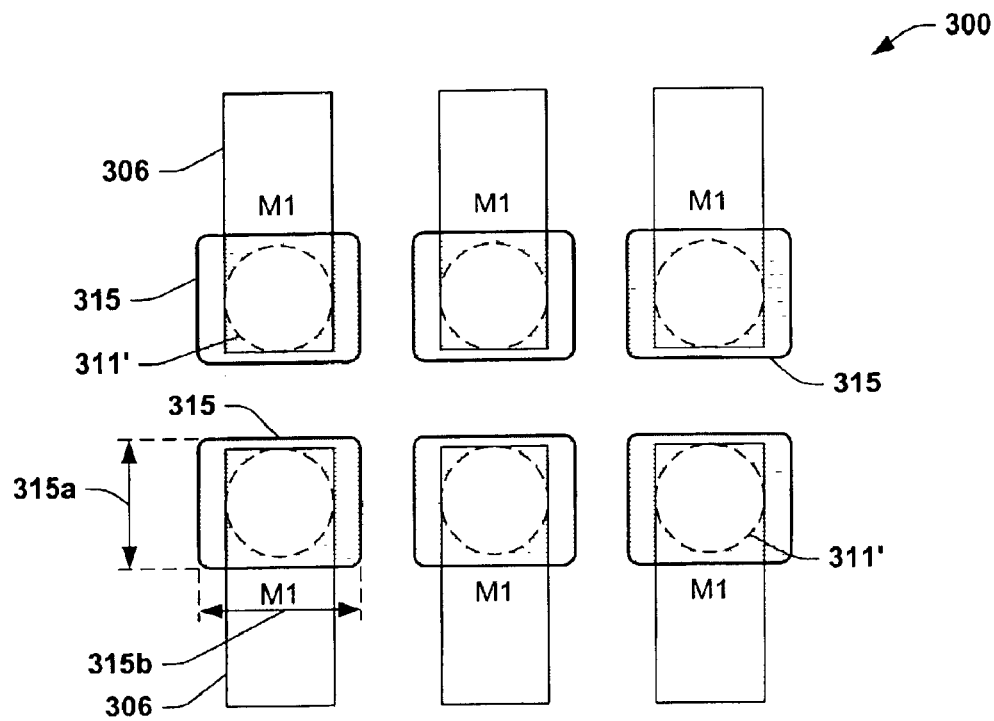
FIG. 3A is a partial plan view illustrating several vias with a surrounding worst case misalignment error region formed in alignment over a corresponding M1 conductive feature, the error regions may be formed in a buried via mask as openings in a semiconductor device in accordance with an aspect of the present invention.
Figure 3B:
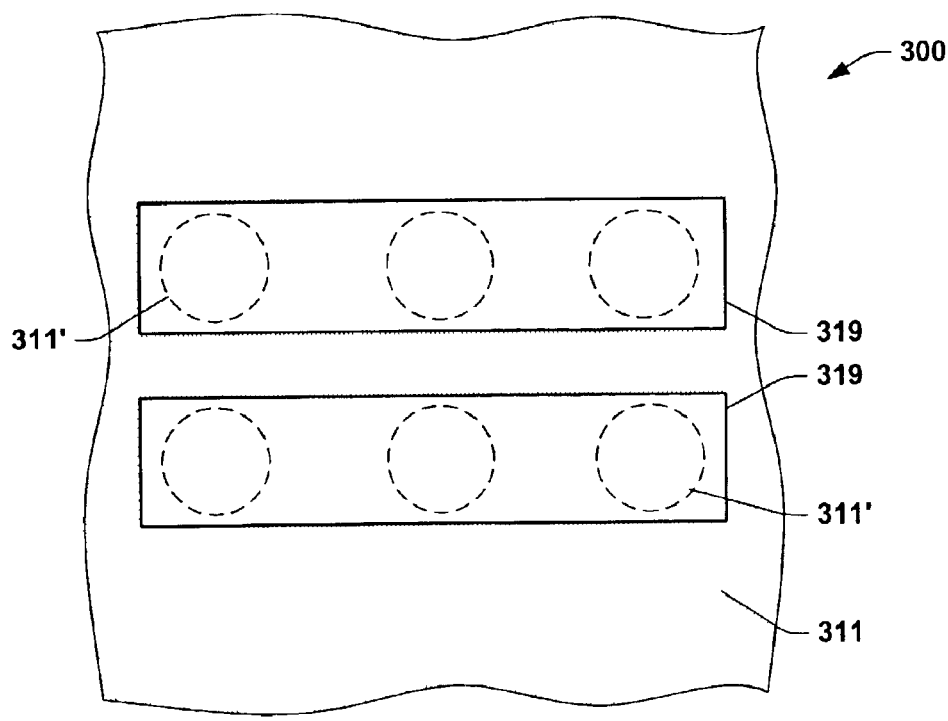
FIG. 3B is a partial plan view illustrating two exemplary rectangular trench etch-stop windows (rectangular windows) in a buried via mask, formed by merging three adjacent worst case misalignment error regions of three vias, the error regions aligned orthogonal to a long axis of the underlying M1 conductive features in the device of FIG. 3A.

For example, FIGS. 3A and 3B illustrate the development of the concept, while FIGS. 3B–3F, and FIGS. 4A–4D illustrate an exemplary method of forming vias and trenches for a conductive interconnect in a semiconductor device 300 of the present invention. FIGS. 3A–3F illustrate partial plan views, while FIGS. 4A–4D illustrate cross sectional side views of several vias and trenches formed in the semiconductor device 300 in accordance with an exemplary aspect of the present invention.

In FIG. 3A, a semiconductor device 300 is illustrated at an intermediate stage of fabrication processing, wherein one or more electrical devices (e.g., transistors, memory cells, etc., not shown) have been formed on or in a substrate (not shown), such as silicon. In order to interconnect such devices, and/or to provide external connections thereto, interconnect processing is employed to fabricate one or more levels of conductive connection metal lines (e.g., copper) for forming a desired circuit. Copper-filled vias are formed to vertically provide electrical connections from one such level to another, wherein insulative dielectric material is formed between such trenches and vias to isolate unconnected conductive features from one another.

Several conductive features 306 are shown formed in an M1 first metal layer overlying a substrate in the semiconductor device 300. Several vias 311' are formed in alignment over corresponding M1 first metal conductive features 306. A worst case misalignment error region 315 around each via 311' has an error width 315a and an error length 315b. The worst case misalignment error region 315 associated with each via 311', represents a region of possible positions, whereat a via 311' may have been placed by an opening in a buried via mask using a conventional approach. Note that in the via, trench, or interconnect formation method of the present invention, a via will not be formed using a conventional method, and a circular via will not be formed as shown by dashed circle 311', but rather, is only referenced herein as a point of contrast to the present invention, or to indicate the center of the worst case misalignment error region 315.

FIG. 3B is a partial plan view illustrating two exemplary generally rectangular trench etch-stop window openings 319 (or simply, rectangular windows), in a buried via mask in the device of FIG. 3A. The inventors have further appreciated that by merging worst-case misalignment error regions 315 of adjacent vias 311' into windows 319 in the buried via mask, wherein the windows 319 are aligned or extend orthogonal to the long axis of the underlying metal conductive features, self-aligned interconnects are generated.

Figure 3C:
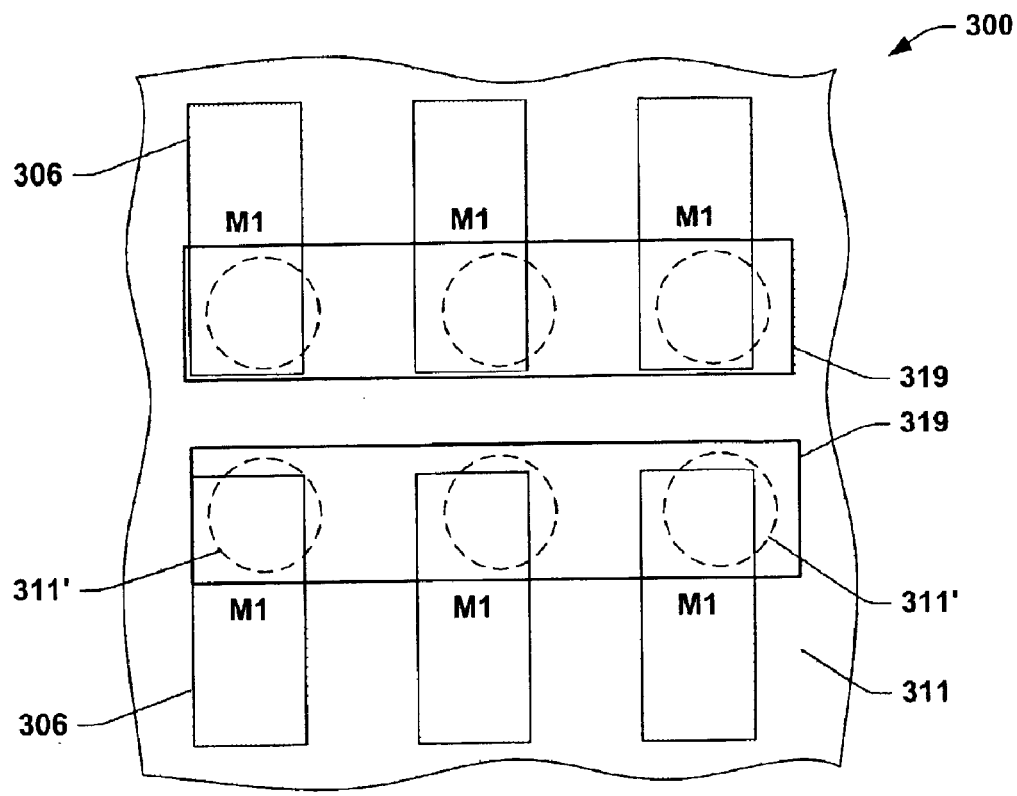
FIG. 3C is a partial plan view illustrating two exemplary rectangular windows in a buried via mask, the windows shown in worst case misalignment position over the underlying M1 conductive features in the device of FIGS. 3A–3B, and for contrast, demonstrating worst case via positions created by a prior art.

FIG. 3C, for example, is a partial plan view illustrating two exemplary generally rectangular trench etch-stop windows 319 in a buried via mask in the etch-stop material 311. The two rectangular windows 319 are formed by merging three adjacent worst case misalignment error regions 315 of three vias 311', and the windows 319 are generally aligned orthogonal to the long axis of at least one of the underlying metal conductive features 306 in the semiconductor device 300 of FIG. 3A. Windows 319 are shown in worst case misalignment position over the underlying M1 metal conductive features 306 in the device 300 of FIGS. 3A–3B. For contrast, vias 311' formed by a prior art method are shown in worst case positions.

Figure 3D:
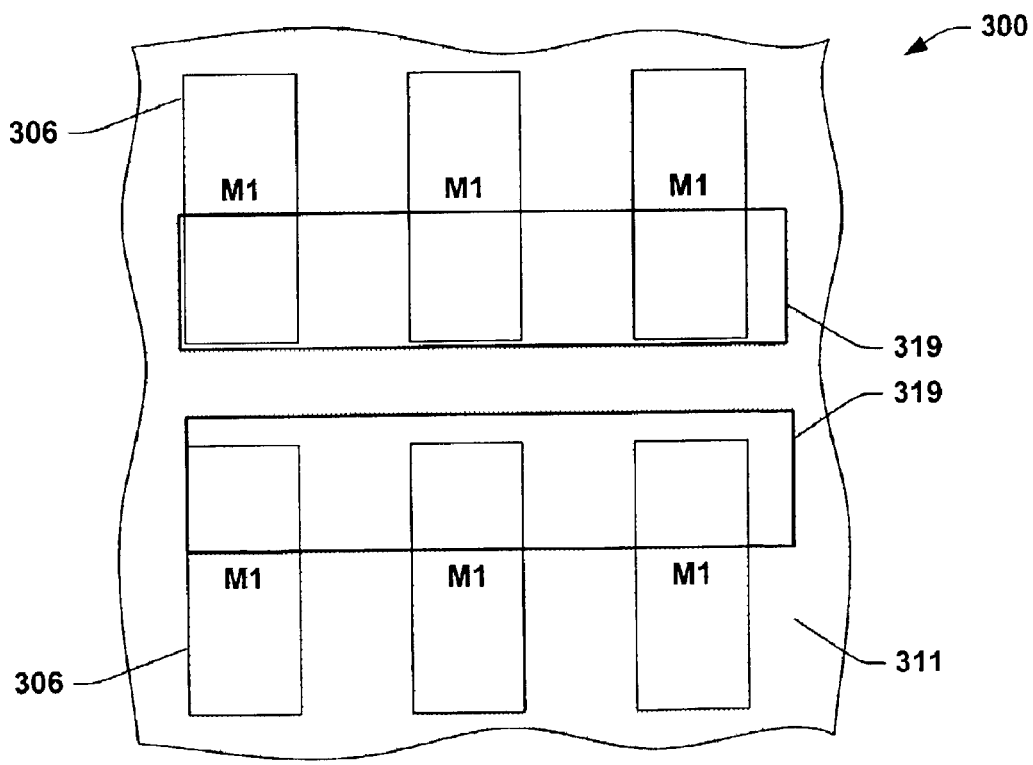
FIG. 3D is a partial plan view illustrating two exemplary rectangular windows in a buried via mask, the windows shown in worst case misalignment position over the underlying M1 conductive features in the device of FIGS. 3A–3C.

FIG. 3D is a partial plan view illustrating two exemplary windows 319 in a buried via mask in the etch-stop material 311. The windows 319 are shown in worst case misalignment position, formed over the underlying M1 metal conductive features 306 in the semiconductor device 300 of FIGS. 3A–3C in accordance with an aspect of the present invention. Note, vias formed by a prior art are indicated as circular vias, shown merely for contrast to the present invention. Further, although the windows 319 are illustrated as being generally rectangular, the window may comprise any one of various shapes and such variations (e.g., an elliptical window) are contemplated as failing within the scope of the present invention. In addition, although the windows 319 are illustrated as traversing three lines or features 306, the windows may extend over two or more features, as may be appreciated.

Figure 3E:
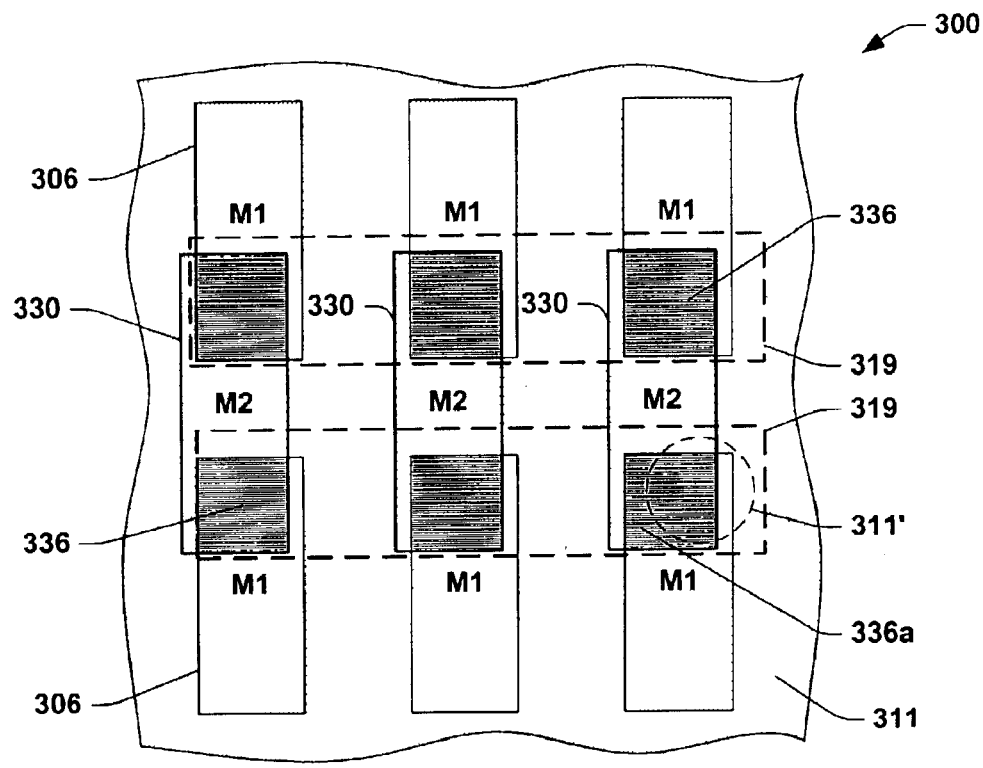
FIG. 3E is a partial plan view illustrating contact areas created by two exemplary rectangular windows in a buried via mask, the windows shown in worst case misalignment position over the underlying M1 conductive features, further illustrating three corresponding M2 second metal layer conductive features in worst case misalignment position aligned orthogonal over the underlying rectangular windows in the device of FIGS. 3A–3D, and for contrast, demonstrating a smaller contact area of a worst case position conventional via.

FIG. 3E illustrates a partial plan view of the formation of several second metal layer conductors (M2) 330 and several via contact areas 336 in the semiconductor device 300 of FIGS. 3A–3D. Via contact areas 336 are created in areas where the second metal layer conductor (M2) 330, the underlying metal conductive feature (M1) 306, and the rectangular window 319 in the etch-stop material 311 coincide. For contrast, note the additional contact area 336a (outside the 311' circle) provided by the present invention compared to the smaller contact area of a worst case conventional via 311'. Note that in the method of the present invention, the contact interface of the via and the M1 conductive feature is self-aligned predominantly by the shapes of the M2 and the M1 conductive features, and is substantially less limited by the via mask than a conventional method.

Figure 3F:
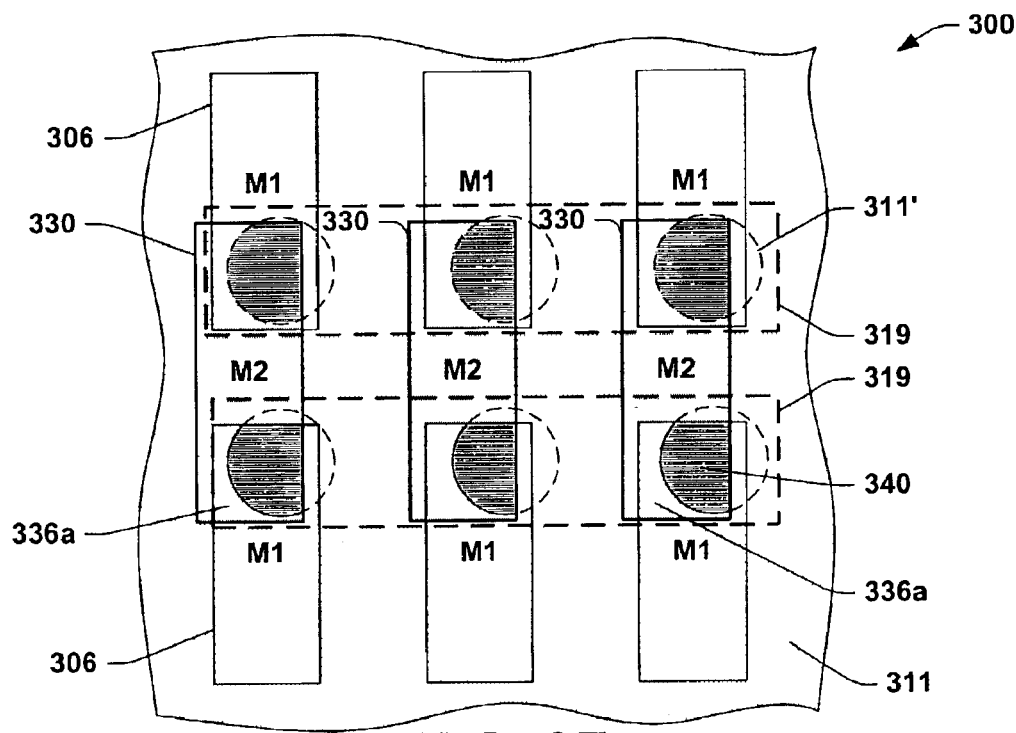
FIG. 3F is a partial plan view illustrating the smaller contact areas of the worst case position conventional vias relative to a contact areas created by two exemplary rectangular windows in a buried via mask, the windows shown in worst case misalignment position over the underlying M1 conductive features, and three corresponding M2 second metal layer conductive features shown in worst case misalignment position, aligned orthogonal over the underlying rectangular windows in the device of FIGS. 3A–3E.

FIG. 3F is a partial plan view illustrating the smaller contact areas of the worst case conventional vias relative to the contact areas created by two exemplary rectangular windows 319 in a buried via mask in the semiconductor device 300 of FIG. 3E. FIG. 3F demonstrates the contrast in the smaller contact area 340 of a conventional method approach and the additional contact area 336a of the present invention. As indicated in FIG. 3E, via contact areas 336 are formed in the present invention, rather than those of the conventional vias 311'.

Figure 4A:
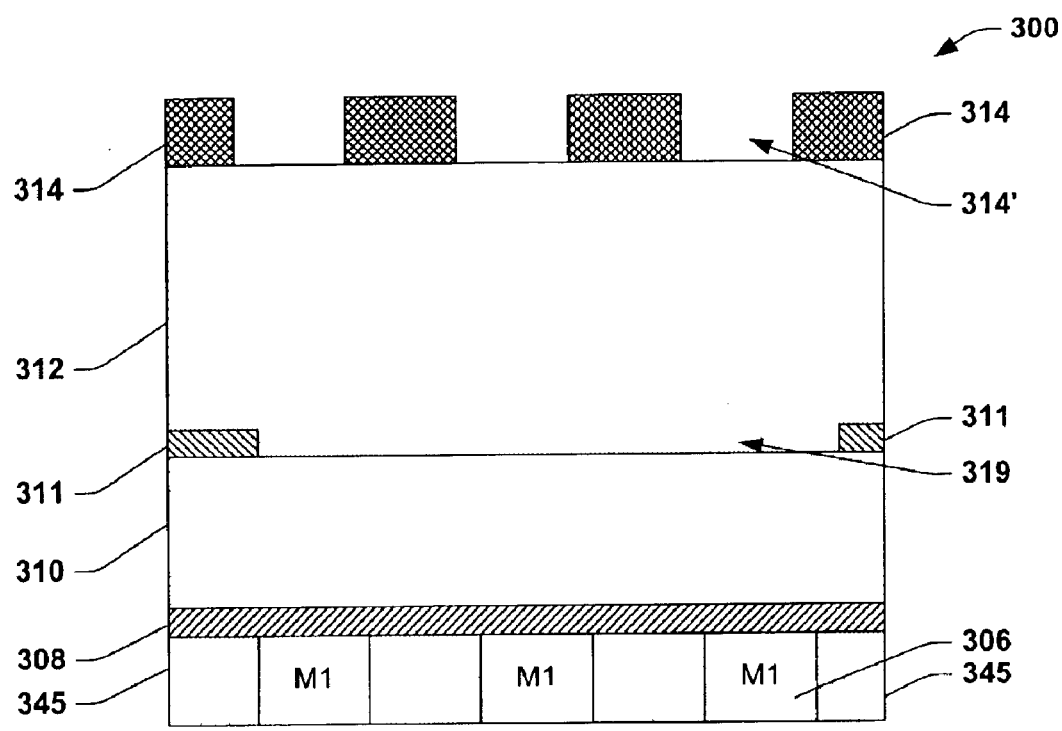
In FIG. 4A illustrates a partial cross-sectional side view of an exemplary semiconductor device having two low-k dielectric layers deposited over metal conductive features in a substrate and a trench etch-stop layer used as a buried via mask as part of a dual damascene process in accordance with an exemplary method of the present invention for forming the semiconductor device of FIGS. 3A–3E, shown prior to the etching of a trench and a via in the dielectric layers for forming a set of three conductive interconnects.

In FIG. 4A, a partial cross-sectional side view of an exemplary semiconductor device 300 is illustrated at an intermediate stage of fabrication processing of conductive interconnects as part of a dual damascene process in accordance with an aspect of the present invention and a method of forming the semiconductor device 300 of FIGS. 3A–3E.

In particular, FIG. 4A illustrates a stage of fabrication immediately prior to the etching of a trench and a via in the dielectric layers for forming a set of three conductive interconnects to provide electrical connection between the conductive features 306 of the M1 metal layer and the M2 metal layer.

To this point of fabrication, the M1 metal layer is formed overlying electrical devices within a substrate (not shown), wherein three conductive features 306 are formed in openings in a metal dielectric material 345 in this example. A diffusion barrier layer (B1) 308 is then optionally formed over the conductive features 306 when the conductive features 306 comprise copper. An ILD1 layer 310 is formed over the barrier layer 308. The ILD1 layer 310 provides insulation between overlying and underlying conductive features and relatively low dielectric constant (low-k) characteristics are desirable in avoiding or mitigating RC delays and cross-talk between signals in the finished integrated circuit of the device 300.

A trench etch-stop layer (TES) 311 is then deposited over the ILD1 layer 310, and one or more windows 319 (e.g., generally rectangular windows) forming openings are etched in the trench etch-stop layer TES 311, as shown in the plan views of FIGS. 3B–3E and FIG. 4A. The rectangular windows 319 are part of a buried via mask in the etch-stop material 311, formed by merging three via regions, for example, adjacent worst case misalignment error regions 315 of three vias. In the present example, the windows are aligned orthogonal to the long axis of each of the associated underlying metal conductive features 306 in the semiconductor device 300 of FIG. 3A. It should be appreciated, however, that the present invention still provides advantages over conventional interconnects when the window is orthogonal to at least one of the features. The trench etch-stop layer (TES) 311 provides a selective stopping point for etching of an overlying trench and the rectangular windows 319 provide a mask for the further etching of the via underlying the trench etch-stop layer 311.

Thereafter, a second inter-level dielectric layer (ILD2) 312 is formed over the TES layer 311, a hard mask layer (HM) 314 is formed over the ILD2 layer 312, and patterned to form openings 314' therein. The HM layer 314 is then used in trench formation in a dual damascene type interconnect process while forming overlying trenches for interconnection of copper metal lines with vias formed through the ILD1 layer 310.

Figure 4B:
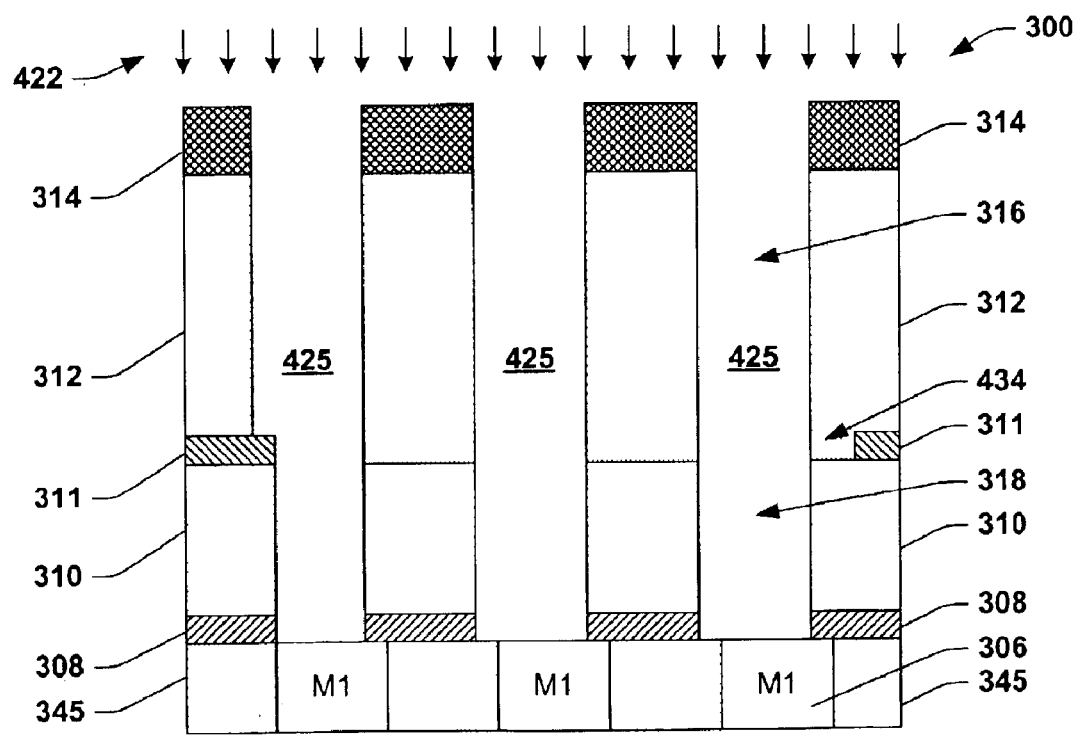
FIG. 4B is a partial cross-sectional side view illustrating etching of the trench and the via in the dielectric layers for forming the set of three conductive interconnects in the device of FIG. 4A.

FIG. 4B is a partial cross-sectional side view of the device 300, illustrating a first etch process 422 performed through the M2 openings 314' in the HM layer 314 to remove the exposed portions of the ILD2 layer 312, leaving a trench cavity 316. The etch process 422 continues by removing the exposed portion of the ILD1 layer 310 and the B1 layer 308 through the buried via mask of the TES layer 311, leaving a via cavity 318, and an exposed portion of the conductive feature 306 in the M1 metal layer. Therefore, a trench (cavity) 316 may be formed above the TES layer 311, and a via (cavity) 318 formed below the TES layer 311, collectively forming an interconnect cavity 425 (316 and 318). The interconnect cavity 425 may then be filled with conductive material and planarized to form a set of three conductive interconnects in the device of FIG. 4A to connect the M1 and M2 conductive features.

Self-aligned vias are provided by the shapes and edges as defined or outlined by the M2 openings 314' in the HM layer 314 and the rectangular window 319 in the TES layer 311. Thus, the M2 openings 314' and the rectangular window 319 coincide to provide an area whose outline guides the etching of the walls and thus defines the via. However, a portion of the via formed as such, may not also fully coincide with the underlying M1 conductive feature 306, as indicated by FIG. 3E. Where the via is formed over, and actually coincides with (contacts) the M1 conductive feature 306, defines the contact area 336 (see, e.g., FIG. 3A).

Thus, contact areas 336 are defined by those areas in which the M1 and M2 conductive features and the window (merged via window) of the buried via mask coincide. The size of the worst-case misalignment error margin regions ensure that the positioning of a via will be placed within this window and the rectangular window produced by the merging of these regions. Therefore, any positioning error which results from an offset 434 in the position of the rectangular window 319 only causes a slight reduction in the contact area 336 of the conductive interconnect which is no worse than a conventional masking method. Thus, in the method of the present invention, the negative effects of contact resistance, power consumption, and photo re-work at via and trench levels are thereby minimized.

Figure 4C:
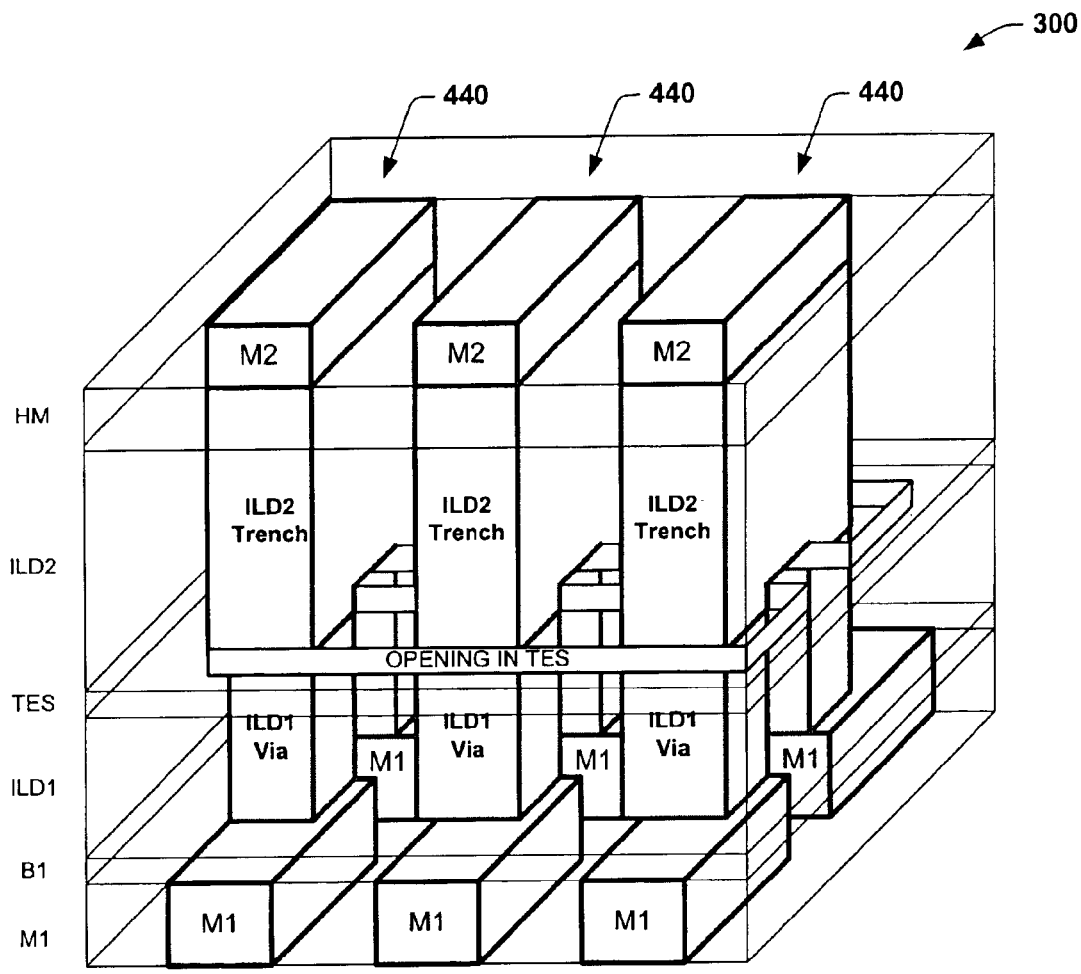
FIG. 4C is a partial isometric projection further illustrating the exemplary formation of the trench and the via in the inter-level dielectric layers through two rectangular windows in the trench etch-stop layer and the hard mask for forming a set of three conductive interconnects in the device of FIGS. 4A–4B.

FIG. 4C further illustrates a partial isometric projection of the exemplary device 300, and the formation of the trench 316 and the via 318 in the inter-level dielectric layers 310,312 through two generally rectangular windows 319 in the trench etch-stop layer material 311 and the hard mask openings 314' in the hard mask 314. When the trench 316 and via 318 are filled with a conductive material and planarized to the HM layer 314, a set of three conductive interconnects 440 is formed in the semiconductor device 300 of FIGS. 4A–4B.

Figure 4D:
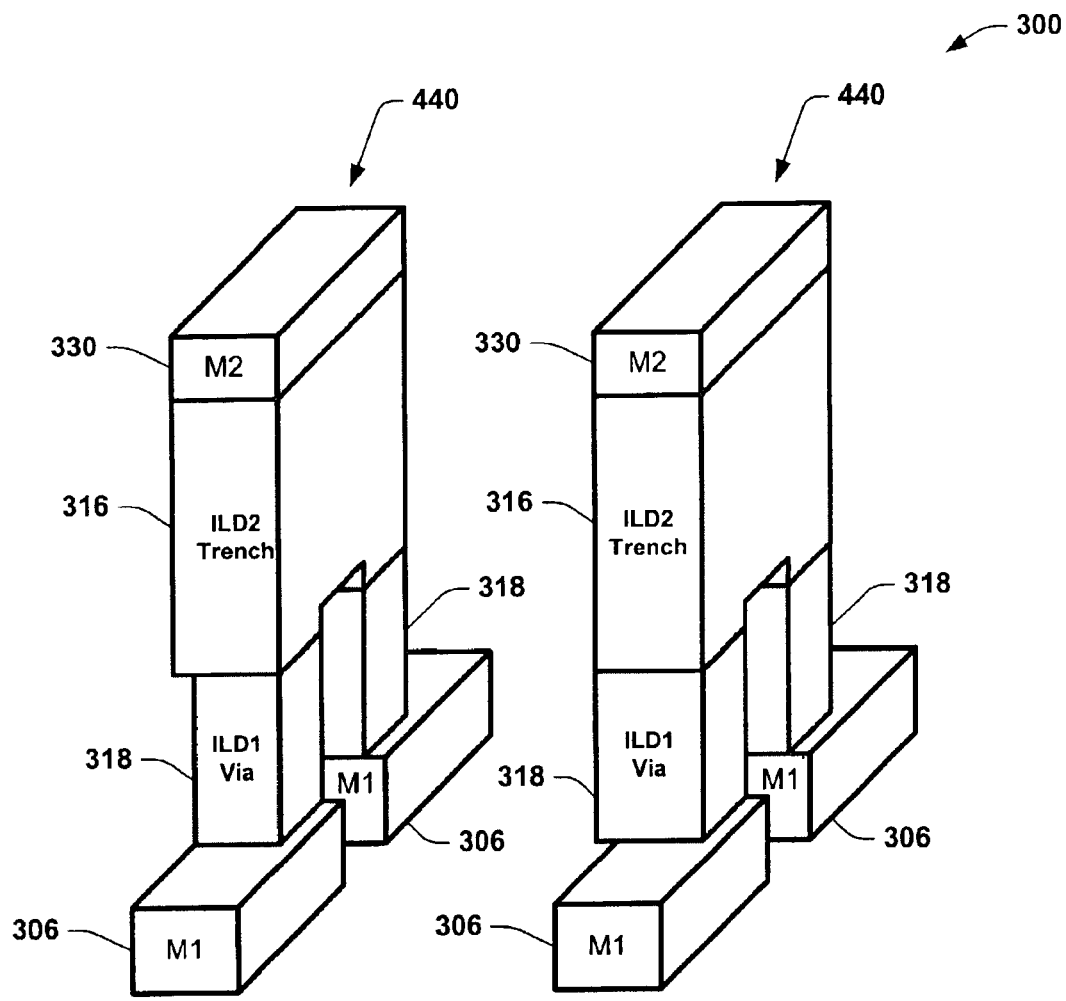
FIG. 4D is a partial isometric projection illustrating two of the three conductive interconnects formed in the device of FIGS. 4A–4C, shown without the outer layering and masks for clarity.

FIG. 4D is a partial isometric projection illustrating two of the three conductive interconnects 440 formed in the device 300 of FIGS. 4A–4C, shown without the exterior layering and masks for clarity. Each conductive interconnect 440 comprises an M1 conductive feature 306 in the first metal M1 layer, a via 318, a trench 316, and an M2 conductive feature 330 in the second metal M2 layer, wherein all the cavities or elements are filled with one or more conductive materials (e.g., copper, tungsten, aluminum). In the exemplary device 300, two M1 conductive features 306 (front and back M1 line segments) are electrically interconnected by way of the two ILD1 vias 318 and the ILD2 trench 316, which also interconnects the M1 and M2 conductive features 306, 330.

Figure 5:
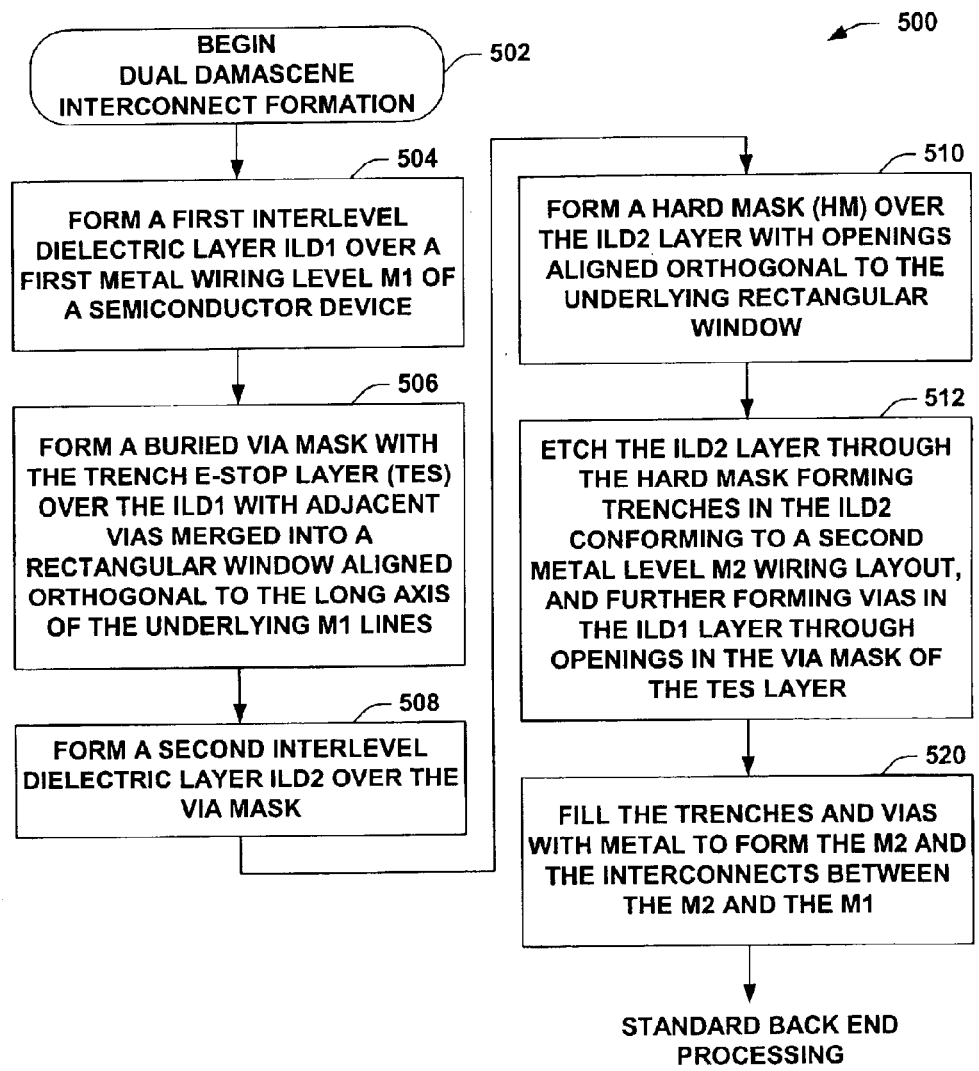
FIG. 5 is a flow diagram illustrating an exemplary method of forming a dual damascene conductive interconnect in a semiconductor device in accordance with an aspect of the present invention.

FIG. 5 illustrates one exemplary method 500 for forming a dual damascene interconnect in a semiconductor device in accordance with the present invention, wherein a buried via mask may be advantageously used and aligned orthogonal to underlying conductive features in the formation of a self-aligned conductive interconnect. The inventors have appreciated that self-aligned interconnects are possible by merging worst-case misalignment error regions (e.g., 315 of FIG. 3A) of adjacent vias into rectangular window openings (e.g., 319 of FIGS. 3B–3E, and FIG. 4A) in the buried via mask, wherein the rectangular window openings 319 are aligned orthogonal to the long axis of the underlying metal conductive features. The method of the invention advantageously allows greater misalignment error margins without decreasing contact surface area owing to the self-aligned interconnects, and may by contrast, provide increased contact surface area to mitigate problems of contact resistance and the resulting power consumption.

While the method 500 and other methods herein are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated.

The method 500 involves forming an interconnect downward through a first and second dielectric layer and a buried via mask in a trench etch-stop layer disposed therebetween so as to expose a conductive feature beneath the diffusion barrier layer. Although described herein in association with forming an interconnect, the methods of the present invention, including the exemplary method 500 are also applicable to formation of dual damascene vias and trenches which may comprise the interconnect. Optionally, where a copper conductive feature is desired, the method may include forming downward through a diffusion barrier layer formed overlying the conductive feature.

Typically, a diffusion barrier layer is formed over a first metal layer comprising a metal dielectric material wherein openings and subsequently the conductive features are formed. The diffusion barrier layer acts to prevent copper atoms (for example, when copper is employed) from migrating from the conductive features into the first dielectric layer material. The buried via mask is formed over the first dielectric layer and beneath the second dielectric layer material to act as a trench etch-stop layer during formation (e.g., etching) of the trench opening or cavity through the second dielectric layer, and as a mask for the formation of the via opening or cavity through the first dielectric layer. A hard mask layer formed over the second dielectric layer is also etched in forming the trench cavity, which when etched further through the first dielectric layer forms the via cavity and completes the interconnect cavity. When the trench and via are filled with a conductive material and planarized to the hard mask layer, a conductive interconnect (e.g., 440 of FIGS. 4C–4D) is formed in the semiconductor device (e.g., 300 of FIGS. 4A–4D).

Beginning at 502, the interconnect formation method 500 comprises forming a first inter-level dielectric layer (ILD1) (e.g., 310 of FIG. 4A) at 504 over a first metal layer (M1) comprising a conductive feature (e.g., 306 of FIG. 4A) for electrical interconnection to a second metal layer (M2) at another level.

At 506, a buried via mask is formed within the trench etch-stop (TES) layer (e.g., 311 of FIG. 4A) over the ILD1 layer 310, wherein worst-case mis-alignment error regions 315 of adjacent vias are merged together into an opening or window 319 aligned orthogonal to the long axis of at least one of the underlying conductive features 306 in the first metal M1 layer. In one example, the ILD1 layer 310 comprises a porous low-k dielectric material. The overall size of the worst-case alignment error margin regions, either separately, or in combination with these regions merged into the rectangular window, ensures that a via or interconnect formed thereby will be self-aligned to, and provide the maximum available contact area on the underlying conductive feature.

At 508, a second inter-level dielectric layer (ILD2) (e.g., 312 of FIG. 4A) is deposited over the patterned buried via mask of the TES layer 311. In one example, the ILD2 layer 312 comprises a porous low-k dielectric material. At 510, a hard mask is formed over the ILD2 layer 312 with openings (e.g., 314' of FIG. 4A) in the hard mask aligned orthogonal to the underlying rectangular window 319. Later, openings 314' will be filled with conductive material from the second metal M2 layer forming the M2 conductive features (e.g., 330 of FIGS. 3E and 4D) in the second metal M2 layer.

At 512, the trench and via cavities are formed (e.g., by etching) in the inter-level dielectric layers, wherein a portion of the ILD2 layer 312 is removed through the openings 314' in the hard mask down to the rectangular window 319 in the etch-stop layer 311 to form trenches (e.g., 316 of FIG. 4B) in the ILD2 layer 312 conforming to the second metal M2 wiring layout. Further, the etching continues selectively through the rectangular window 319 to remove portions of the ILD1 layer 310 to form vias (e.g., 318 of FIG. 4B) in the ILD1 layer conforming to, and self-aligned to the shapes and edges of the areas in which the M2 openings 314' and the rectangular window 319 coincide.

Thus, in the method of the present invention, individual via mask openings for each and every via are unnecessary, as the shape and size of the M2 openings 314' and the window 319 aligned orthogonal to one another, guide (self-align) the formation of the vias to the underlying M1 conductive features. The actual contact area (e.g., 336 of FIG. 3E) of the via 318 and the M1 conductive feature 306 conforms to the shapes and edges of the areas in which the features of the M1, M2, and the window coincide. Therefore although the features and windows are illustrated as sharp-cornered features, lithography causes most features to be rounded, and shapes may be varied, as may be appreciated, and such variations are contemplated by the present invention.

Further, the method of the present invention allows greater misalignment (positioning) error margins of the M2 openings 314', or the rectangular window 319 without decreasing the contact surface area at the interface of the underlying M1 conductive features 306. By contrast, the self-aligning interconnect formation feature of the method, may increase the contact surface area to mitigate problems of contact resistance and the resulting power consumption.

At 520, the trenches 316 and vias 318, comprising the interconnect cavity 425, are filled with one or more conductive materials (e.g., copper, tungsten, aluminum). The conductive material is deposited through the M2 openings 314' typically during the formation of the M2 conductive features (e.g., 330 of FIGS. 3E and 4D) of the second metal M2 layer. The filled interconnect cavity 425 forms the conductive interconnect 440 to electrically connect the conductive features 306, 330 of the M1 and M2 layers for the interconnection of electrical devices in a semiconductor device. As discussed, in the exemplary device 300, two M1 conductive features 306 (front and back M1 line segments) are electrically interconnected by way of the two ILD1 vias 318 and the ILD2 trench 316, which also interconnects the M1 and M2 conductive features 306, 330. However, in other type devices, the interconnections may be varied, as may be appreciated.

Thereafter, a CMP planarization of the hard mask 314 may be performed subsequent to the M2 deposition step, for example, followed by further standard back end processing, after which the dual damascene interconnect formation method 500 ends.

Figure 6:
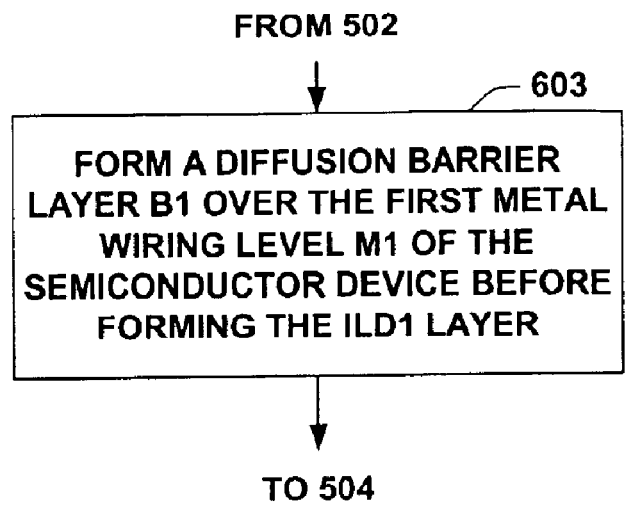
FIG. 6 is a flow diagram illustrating a further diffusion barrier layer formation step of the method of FIG. 5.
Figure 7:
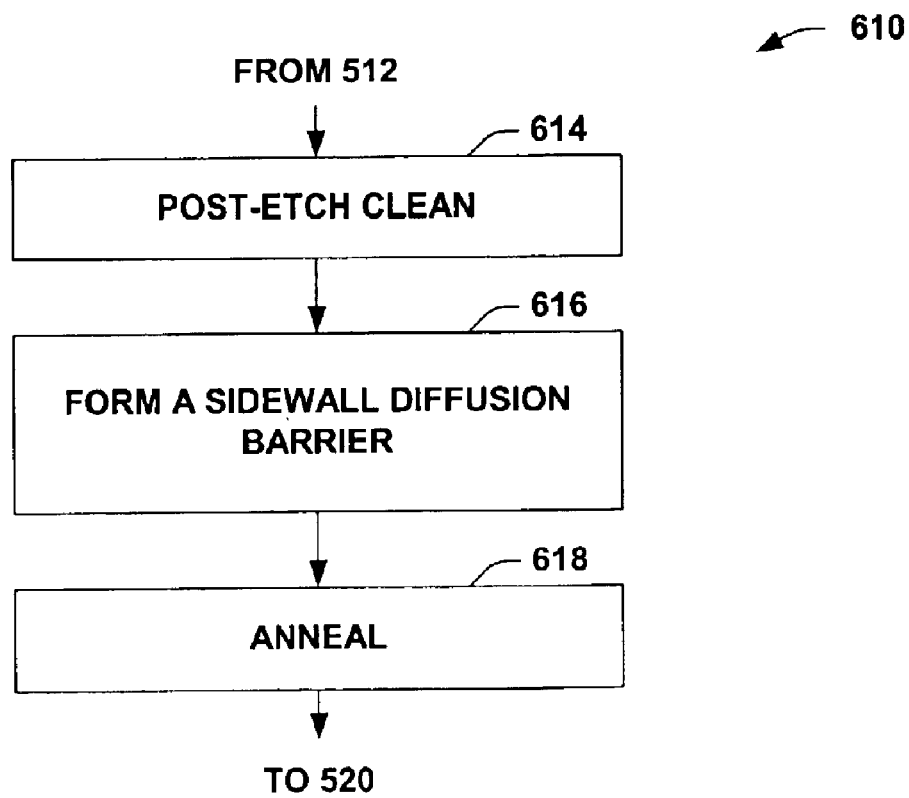
FIG. 7 is a flow diagram illustrating further post-etch clean, sidewall diffusion barrier layer formation, and anneal steps of the method of FIG. 5.

Referring also to FIG. 6, a further exemplary diffusion barrier layer deposition 603 is illustrated. The diffusion barrier layer (B1) 308 may be used, for example, in association with a copper conductive material deposition, such as, over the M1 conductive features 306. After the dual damascene interconnect formation begins at 502 of the method 500, a diffusion barrier layer (e.g., 308 of FIGS. 4A–4B) is deposited at 603 over the first metal M1 layer of the semiconductor device 300, and before the formation of the ILD1 layer 310 at 504. Referring also to FIG. 7, a further exemplary diffusion barrier layer cleaning and deposition 610 is illustrated. Again, a different diffusion barrier (which is conductive) is typically used, for example, before depositing a copper conductive material in the vias and trenches, to protect the sidewalls of the interconnect cavity. After the etching the interconnect cavity (e.g., 425 of FIG. 4B) at 512 of the method 500, continues with a post-etch clean of the interconnect cavity 425 at 614. At 616 a diffusion barrier layer (not shown) is then deposited over the sidewalls of the interconnect cavity 425 and the M1 conductive feature 306 of the semiconductor device 300. Thereafter, at 618 an anneal is performed and the method 500 continues at 520 wherein the interconnect cavity 425 is filled with copper, for example, or another conductive material which may require a diffusion barrier layer.

Thus, a self-aligned interconnect may be formed by merging worst-case misalignment error regions 315 of adjacent vias into rectangular windows 319 in a buried via mask of an etch-stop layer, wherein the rectangular windows 319 are aligned orthogonal to the long axis of the underlying metal conductive features. The method of the invention advantageously allows greater misalignment error margins without decreasing contact surface area owing to the self-aligned interconnects, and may provide increased contact surface area to minimize problems of contact resistance and the consequential power consumption in accordance with the invention.

Figure 8:
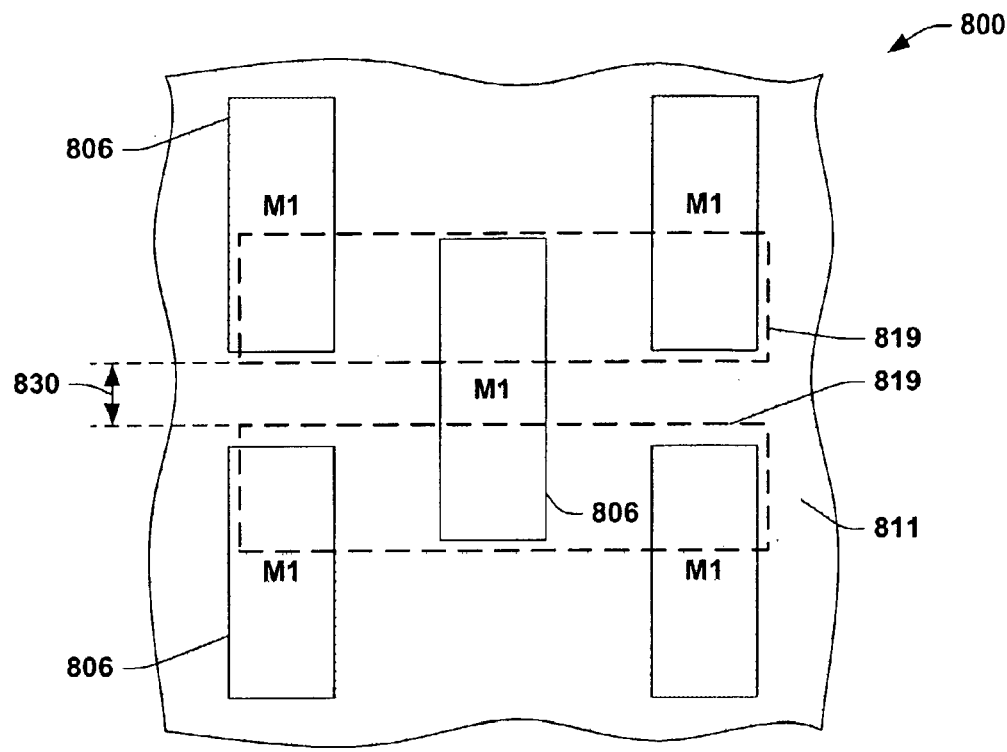
FIG. 8 is a partial plan view illustrating another exemplary formation of rectangular windows in trench etch-stop layer of a buried via mask, formed by merging three staggered, yet still adjacent vias aligned orthogonal to the long axis of the underlying metal conductive features in a semiconductor device, in accordance with the buried via mask approach of the present invention and similar to that of FIG. 3D.

In FIG. 8, a semiconductor device 800 is illustrated at an intermediate stage of fabrication processing similar to the method previously described. Conductive features 806 of an M1 metal layer are covered with a TES material layer 811 which also acts as a buried mask. Adjacent worst-case misalignment error regions (e.g., similar to 315 of FIG. 3A) with associated prospective via locations are merged together as before, into rectangular windows 819 in the TES material layer 811, and aligned orthogonal to the underlying M1 metal layer conductive features 806. The windows 819 are spaced apart by a distance 830, and is similar to the description of that of FIG. 3C and 3D and as such, need not be fully described. FIG. 8 demonstrates that prospective via locations need not be in identical positions on the underlying conductive features 806 to provide adjacent error regions for the formation of the rectangular windows 819 in the buried mask.

These and other aspects of the invention may be carried out in association with via or trench formation in any type of interconnect process, including but not limited to single and dual damascene processes. However, it is noted at this point that the invention is not limited to such specific applications, and further that the structures illustrated and described hereinafter are not necessarily drawn to scale.

Figure 9:
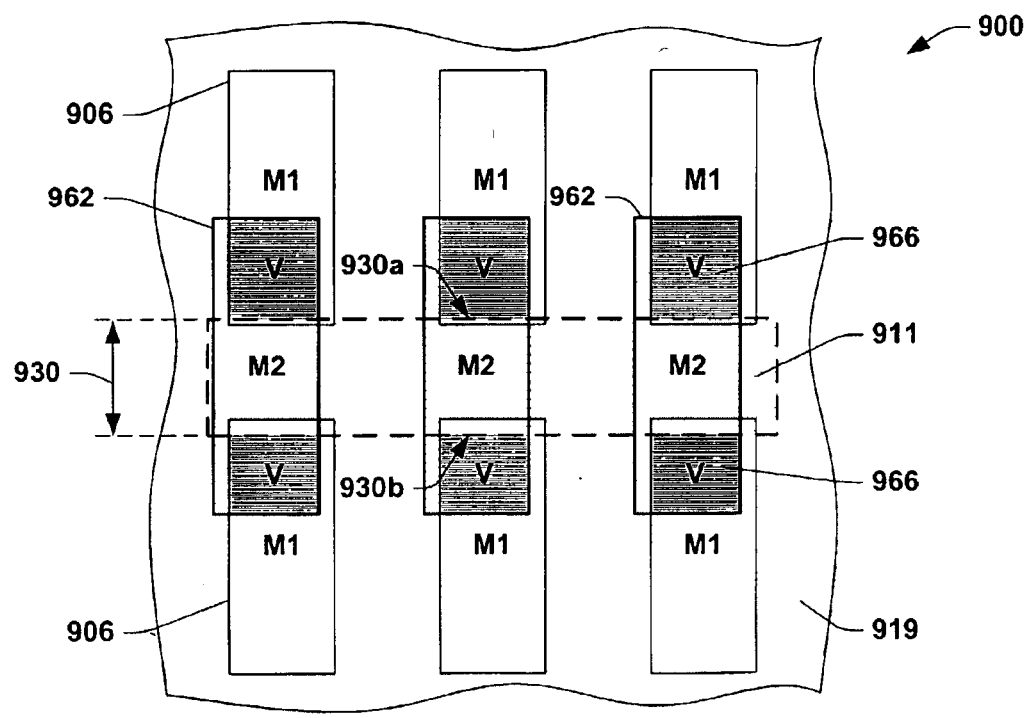
FIG. 9 is a partial plan view illustrating exemplary contact areas created by an alternate method of the invention in a semiconductor device, having a reverse trench etch-stop material region in a buried via mask, wherein the etch-stop material separates conductive features so as to define one side of each via, and forming a larger etch stop window surrounding the etch-stop region and merging adjacent vias aligned orthogonal to the M1 and M2 metal conductive features, which are shown in misalignment positions relative to each other and aligned orthogonal to the trench etch-stop material region disposed therebetween.

In FIG. 9, a semiconductor device 900 is illustrated at an intermediate stage of fabrication processing similar to the methods previously described, and to that of FIG. 8. Semiconductor 900 is a slight variation of that described for FIGS. 3B–3E, and as such need not be fully described. Again, the conductive features 906 of an M1 metal layer are covered with a TES material layer which also acts as a buried mask. Adjacent worst-case misalignment error regions (e.g., similar to 315 of FIG. 3A) with associated prospective via locations are merged together as before, into rectangular window openings in the TES material layer 911, with the window openings aligned orthogonal to the underlying M1 metal layer conductive features 906. FIG. 9 demonstrates that the two windows (e.g., 319 of FIG. 3E) may be further merged into a larger single window opening 919, leaving only the TES material 911 between the non-adjacent vias. Thus formed, the larger single window opening 919 surrounds rectangular islands 911 of the TES material (embedded etch-stop material) with width 930.

Note, the via may be formed by self-alignment using the TES material width 930, guided by edges 930a and 930b to form one wall of the via cavity, and by the shape of the M2 conductive features 962 to guide the other 3 walls of the via cavity, providing a via V contact area 966. In the approach of FIG. 9, the trench etch-stop layer has more open area compared to the first approach.

Figure 10:
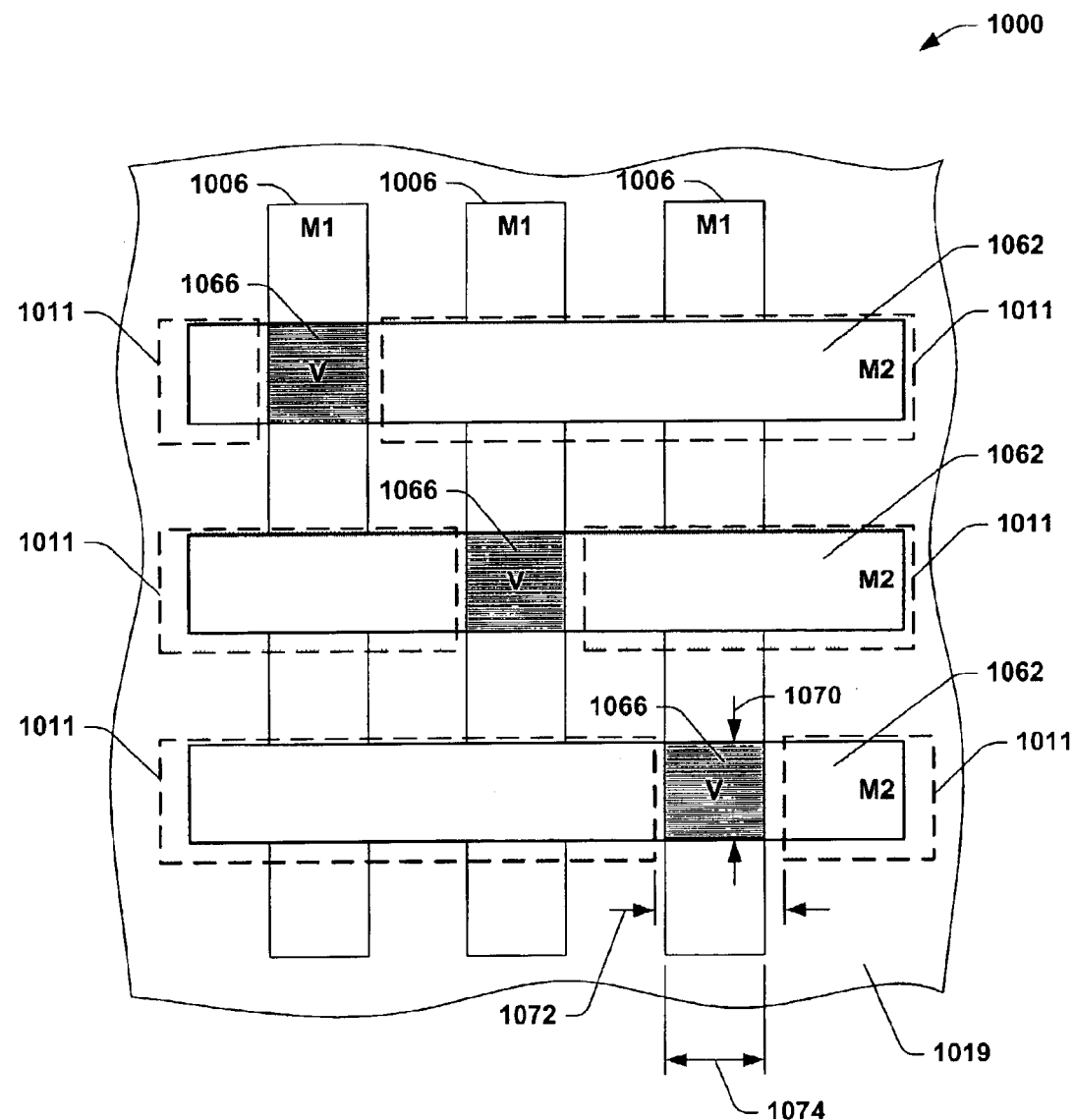
FIG. 10 is a partial plan view illustrating another exemplary semiconductor device having a low-k dielectric layer deposited over a substrate as part of a dual damascene process in accordance with another aspect of the invention, having a reverse trench etch-stop material region in a buried via mask, wherein the hard mask openings define two sides of each via, the etch-stop material separating conductive features so as to define two other sides of each via forming a larger etch stop window merging adjacent vias (diagonally in this case) and surrounding the etch-stop region aligned orthogonal to the long axis of the underlying M1 metal conductive features and aligned to the overlying M2 metal conductive features disposed between the M1 and the M2 layers.

FIG. 10 illustrates another aspect of the invention, wherein a via is formed in a semiconductor device 1000 for connecting a conductive feature in a first level with a second level. The illustrated portion of the interconnect approach involve several underlying M1 conductive features 1006, the TES material layer which remains after merging rectangular windows into a larger single window opening 1019, and overlying M2 conductive features 1062 which are orthogonal to the underlying M1 conductive features 1006. Thus formed, as in the example of FIG. 9, the larger single window opening 1019 surrounds rectangular islands 1011 of the TES material (embedded etch-stop material).

Similar to the example of FIG. 9, the rectangular windows of the larger single window opening 1019 are orthogonal to the M2 conductive features 1062. However, unlike the previous example, this aspect of the invention comprises rectangular window merged into the larger single window opening 1019, which are not orthogonal to the underlying M1 conductive features 1006. Yet, because the windows which self-align the vias are comprised of worst-case misalignment error regions, and the adjacent error regions are merged into a larger single window opening 1019, the vias V are still self-aligned producing full width via M1 conductive feature 1006 contact areas 1066. Note, the via V contact areas 1066 may be formed by self-alignment using the full M2 conductive feature width 1070, while the worst-case misalignment error region length 1072 provides the upper limit on the length of the contact area, allowing the full M1 conductive feature width 1074. Stated another way, the via may be formed by self-alignment using the misalignment error region length 1072 to form two walls of the via cavity, and by the full M2 conductive feature width 1070 to guide the other two walls of the via cavity, providing a full via V contact area 1066.

It will be appreciated by those skilled in the art that the above methodologies may be employed in forming vias, trenches, and a variety of other types of interconnects as part of single or dual damascene interconnect processes. Furthermore, it is to be understood that the above process can be employed during via, trench, and interconnect cavity formation, for example, in a single or dual damascene interconnect formation process.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method for forming a conductive interconnect comprising a trench and a via to connect a conductive feature in a first metal level with a second metal level through a first and a second inter-level dielectric layer formed over the first metal level in a semiconductor device, the method comprising:

forming the first inter-level dielectric layer over the first metal level;

forming a buried via mask over the first inter-level dielectric layer with two or more adjacent via misalignment error regions merged into rectangular windows aligned orthogonal to a long axis of the underlying conductive feature of the first metal level;

forming the second inter-level dielectric layer over the via mask;

forming a hard mask over the second inter-level dielectric layer with openings orthogonal to the underlying rectangular windows;

removing an exposed portion of the second inter-level dielectric layer through to the buried via mask to form the trench, and removing the exposed portion of the first inter-level dielectric layer underlying the rectangular windows in the buried via mask to expose a portion of the conductive feature of the first metal level and to form a via cavity; and forming a conductive material over the semiconductor device so as to fill the trench and the via cavity created by the etch process, the conductive material forming the conductive interconnect providing electrical connection to the conductive feature.

2. The method of claim 1, further comprising initially forming a diffusion barrier layer over the first metal level of the semiconductor device before forming the first inter-level dielectric layer.

3. The method of claim 2, wherein the diffusion barrier layer comprises one of Ta, tantalum nitride, tantalum silicon nitride, PVD tantalum, titanium nitride, tungsten nitride, and a diffusion barrier material.

4. The method of claim 1, further comprising:
cleaning the trench and the via cavity after the etch process;
forming a sidewall diffusion barrier over the sidewalls of the trench and the via cavity; and
annealing the semiconductor device before the formation of the conductive interconnect.

5. The method of claim 1, wherein one of the first and the second inter-level dielectric layer comprises one of OSG, FSG, a low-k dielectric material, and an ultra low-k dielectric material.

6. The method of claim 1, wherein the buried via mask comprises one of SiN, SiC, SiC:H, and an embedded etch-stop material.

7. The method of claim 6, wherein forming a buried via mask over the first inter-level dielectric layer with two or more adjacent via misalignment error regions merged into rectangular windows aligned orthogonal to a long axis of the underlying conductive feature of the first metal level comprises:

forming the buried via mask using the embedded etch-stop material over the first inter-level dielectric layer;

determining a via misalignment error region around a prospective via;

merging the via misalignment error regions of two or more adjacent vias into the rectangular windows, wherein the rectangular windows are each larger than the sum of the two or more adjacent via misalignment error regions; and aligning the rectangular windows orthogonal to the long axis of the underlying conductive feature of the first metal level.

8. The method of claim 7, further comprising merging two of the rectangular windows into a larger single window opening around rectangular islands of the embedded etch-stop material.

9. The method of claim 1, wherein removing an exposed portion of the second inter-level dielectric layer through to the buried via mask to form the trench, and removing the exposed portion of the first inter-level dielectric layer underlying the rectangular windows in the buried via mask to expose a portion of the conductive feature of the first metal level and to form a via cavity comprises:

etching the second inter-level dielectric layer trough openings in a hard mask, thereby forming the trench down to the buried via mask, and continuing the etching process into the first inter-level dielectric layer through openings in the buried via mask; and stopping the etching process when a portion of the conductive feature of the first metal level is exposed, thereby forming the via cavity underlying the buried via mask and overlying the conductive feature of the first metal level.

10. A method of forming a cavity in a dual damascene interconnect process, the method comprising:

forming a first inter-level dielectric layer over a conductive feature;

forming an etch-stop layer used as a buried via mask over the first inter-level dielectric layer;

forming a second inter-level dielectric layer over the etch-stop layer;

forming a hard mask layer over the second inter-level dielectric layer;

forming a resist pattern over the hard mask layer, the resist pattern exposing the hard mask layer in a prospective cavity region comprising a trench cavity portion and a via cavity portion of the prospective cavity;

etching the exposed hard mask layer to expose the second inter-level dielectric material in the prospective cavity region; and removing an exposed portion of the second inter-level dielectric layer forming the trench cavity portion in the prospective cavity region through to the buried via mask, while further removing the exposed portion of the first inter-level dielectric layer underlying the opening in the buried via mask to form the via cavity portion and to expose a portion of the conductive feature using an etch process;

wherein forming an etch-stop layer used as a buried via mask over the first inter-level dielectric layer comprises;

forming the buried via mask with an etch-stop material over the first inter-level dielectric layer;

forming a resist pattern over the etch-stop layer, the resist pattern exposing the etch-stop layer in a via cavity portion of the prospective cavity region;

etching the exposed etch-stop layer to expose the first inter-level dielectric material in the via cavity portion of the prospective cavity region;

determining a worst case misalignment error region around a prospective via;

merging the via misalignment error regions of two or more adjacent vias into the rectangular windows, wherein the rectangular windows are each larger than the sum of the two or more adjacent via misalignment error regions; and aligning the rectangular windows orthogonal to the long axis of the underlying conductive feature of the first metal level.

11. The method of claim 10, further comprising initially forming a diffusion barrier layer over the conductive feature before forming the first inter-level dielectric layer.

12. The method of claim 11, wherein the diffusion barrier layer comprises one of Ta, tantalum nitride, tantalum silicon nitride, PVD tantalum, titanium nitride, tungsten nitride, and a diffusion barrier material.

13. The method of claim 10, wherein the prospective cavity region is one of a trench cavity portion and a via cavity portion.

14. A method for forming a conductive interconnect comprising a trench and a via to connect a conductive feature in a first metal level with a second metal level through a first and a second inter-level dielectric layer formed over the first metal level in a semiconductor device, the method comprising:

forming the first inter-level dielectric layer over the first metal level;

forming a buried via mask over the first inter-level dielectric layer with two or more adjacent via misalignment error regions merged into rectangular windows aligned in registry to a long axis of the underlying conductive feature of the first metal level;

forming the second inter-level dielectric layer over the via mask;

forming a hard mask over the second inter-level dielectric layer with openings orthogonal to the underlying rectangular windows;

removing an exposed portion of the second inter-level dielectric layer through to the buried via mask to form the trench, and removing the exposed portion of the first inter-level dielectric layer underlying the rectangular windows in the buried via mask to expose a portion of the conductive feature of the first metal level and to form a via cavity; and forming a conductive material over the semiconductor device so as to fill the trench and the via cavity created by the etch process, the conductive material forming the conductive interconnect providing electrical connection to the conductive feature.

15. The method of claim 14, further comprising initially forming a diffusion barrier layer over the first metal level of the semiconductor device before forming the first inter-level dielectric layer.

16. The method of claim 15, wherein the diffusion barrier layer comprises one of Ta, tantalum nitride, tantalum silicon nitride, PVD tantalum, titanium nitride, tungsten nitride, and a diffusion barrier material.

17. The method of claim 14, further comprising:

cleaning the trench and the via cavity after the etch process;

forming a sidewall diffusion barrier over the sidewalls of the trench and the via cavity; and annealing the semiconductor device before the formation of the conductive interconnect.

18. The method of claim 14, wherein one of the first and the second inter-level dielectric layer comprises one of OSG, FSG, a low-k dielectric material, and an ultra low-k dielectric material.

19. The method of claim 14, wherein the buried via mask comprises one of SiN, SiC, SiC:H, and an embedded etch-stop material.

20. The method of claim 19, wherein forming a buried via mask over the first inter-level dielectric layer with two or more adjacent via misalignment error regions merged into rectangular windows aligned in registry to a long axis of the underlying conductive feature of the first metal level comprises:

forming the buried via mask using the embedded etch-stop material over the first inter-level dielectric layer;

determining a via misalignment error region around a prospective via;

merging the via misalignment error regions of two or more adjacent vias into the rectangular windows, wherein the rectangular windows are each larger than the sum of the two or more adjacent via misalignment error regions; and aligning the rectangular windows in registry to the long axis of the underlying conductive feature of the first metal level.

21. The method of claim 20, further comprising merging two of the rectangular windows into a larger single window opening around rectangular islands of the embedded etch-stop material.

22. The method of claim 14, wherein removing an exposed portion of the second inter-level dielectric layer through to the buried via mask to form the trench, and removing the exposed portion of the first inter-level dielectric layer underlying the rectangular windows in the buried via mask to expose a portion of the conductive feature of the first metal level and to form a via cavity comprises:

etching the second inter-level dielectric layer trough openings in a hard mask, thereby forming the trench down to the buried via mask, and continuing the etching process into the first inter-level dielectric layer through openings in the buried via mask; and stopping the etching process when a portion of the conductive feature of the first metal level is exposed, thereby forming the via cavity underlying the buried via mask and overlying the conductive feature of the first metal level.

23. A method of fabricating an integrated circuit, the method comprising:

forming a first inter-level dielectric layer over a conductive feature of a metal level:

forming an etch-stop layer used as a buried via mask over the first inter-level dielectric layer, the etch-stop layer having a rectangular window aligned orthogonal to a long axis of the conductive feature, the rectangular window overlying a portion of the conductive feature and an adjacent conductive feature of said metal level;

forming a second inter-level dielectric layer over the etch-stop layer;

forming a mask layer over the second inter-level dielectric layer with an opening aligned orthogonal to the rectangular window; and removing an exposed portion of the second inter-level dielectric layer forming a trench cavity at the opening, while further removing the exposed portion of the first inter-level dielectric layer underlying the opening to form a via cavity and expose a portion of the conductive feature.

\* \* \* \* \*